US012787713B2

(12) United States Patent
Dudovitch et al.

(10) Patent No.: US 12,787,713 B2
(45) Date of Patent: Nov. 3, 2026

(54) HYBRID VACUUM ELECTROSTATIC CHUCK CARRIER FOR HIGH WARPAGE WAFERS

(71) Applicant: Applied Materials Israel Ltd., Rehovot (IL)

(72) Inventors: Ofer Dudovitch, Ganey Yohanan (IL); Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 138 days.

(21) Appl. No.: 18/749,474

(22) Filed: Jun. 20, 2024

(65) Prior Publication Data

US 2025/0391699 A1 Dec. 25, 2025

(51) Int. Cl.
*H10P 72/78* (2026.01)
*H10P 72/00* (2026.01)
*H10P 72/72* (2026.01)

(52) U.S. Cl.
CPC .......... *H10P 72/78* (2026.01); *H10P 72/0616* (2026.01); *H10P 72/722* (2026.01)

(58) Field of Classification Search
CPC .... H10P 72/78; H10P 72/0616; H10P 72/722; H10P 72/3306; H10P 72/72
USPC .......................................................... 361/234
See application file for complete search history.

(56) References Cited

U.S. PATENT DOCUMENTS 6,632,512 B1 * 10/2003 Ito .......................... H02N 13/00 174/262
9,740,111 B2 8/2017 Sundarrajan et al.
10,236,201 B2 3/2019 Cox et al.
10,332,773 B2 6/2019 Lee et al.
(Continued)

FOREIGN PATENT DOCUMENTS

CN 113614282 A * 11/2021 .............. H10P 72/78
KR 20210077089 A * 6/2021 .............. H10P 72/76
WO 2020187412 A1 9/2020

OTHER PUBLICATIONS

"Combined Contactless Electrostatic and Vacuum Wafer Chuck", IBM, Technical Disclosure Bulletin, International Business Machines Corporation, vol. 27, No. 10B, XP002121961, Mar. 1, 1985, p. 6222.

(Continued)

*Primary Examiner* — Sreeya Sreevatsa
(74) *Attorney, Agent, or Firm* — Kilpatrick Townsend & Stockton LLP

(57) ABSTRACT

A method of processing a substrate includes positioning the substrate on an upper surface of a modular substrate holder in a first chamber. The substrate holder comprises vacuum channels and electrodes. While within the first chamber, the substrate is clamped and flattened by applying a vacuum to the vacuum channels. A voltage is then applied to the electrodes to further clamp the substrate with an electrostatic force. The first chamber is pumped out to a vacuum pressure. While clamped by the electrostatic force, the modular substrate holder is physically disconnected from the voltage (Continued)

source and transferred from the first chamber into a second chamber under vacuum conditions, relying on residual electrostatic charge to maintain the substrate in a flattened state. Within the second chamber, the electrostatic force is maintained, and the substrate is processed at a vacuum pressure.

20 Claims, 17 Drawing Sheets

(56) References Cited

U.S. PATENT DOCUMENTS

| | | | |
|---|---|---|---|
| 11,196,360 B2 | 12/2021 | Lerner et al. | |
| 2002/0140148 A1 | 10/2002 | Aigner et al. | |
| 2005/0152088 A1 | 7/2005 | Ito et al. | |
| 2008/0217534 A1* | 9/2008 | Seya | G01N 23/2251 250/310 |
| 2015/0162231 A1 | 6/2015 | Cox et al. | |
| 2019/0019712 A1 | 1/2019 | Chito et al. | |
| 2021/0028726 A1 | 1/2021 | Lerner et al. | |

OTHER PUBLICATIONS

EP25183323.2, "Extended European Search Report", Dec. 17, 2025, 9 pages.

EP25183650.8, "Extended European Search Report", Dec. 17, 2025, 9 pages.

EP25183721.7, "Extended European Search Report", Dec. 17, 2025, 6 pages.

U.S. Appl. No. 18/749,484, "Non-Final Office Action", May 21, 2026, 22 pages.

U.S. Appl. No. 18/749,495, "Non-Final Office Action", Jun. 10, 2026, 11 pages.

* cited by examiner

HYBRID VACUUM ELECTROSTATIC CHUCK CARRIER FOR HIGH WARPAGE WAFERS

CROSS-REFERENCES TO RELATED APPLICATIONS

Commonly assigned U.S. patent application Ser. No. 18/749,495, filed Jun. 20, 2024, entitled "Hybrid Vacuum Electrostatic Chuck in Vacuum Chamber for High Warpage Wafers", is hereby incorporated by reference in its entirety.

Commonly assigned U.S. patent application Ser. No. 18/749,484, filed Jun. 20, 2024, entitled "Hybrid Vacuum Electrostatic Chuck in Dedicated Chamber for High Warpage Wafers", is hereby incorporated by reference in its entirety.

BACKGROUND OF THE INVENTION

In the study of electronic materials and processes for fabricating such materials into an electronic structure, samples, such as semiconductor wafers, can be analyzed in a scanning electron microscope (SEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

It is common in such an inspection process to examine multiple locations on a sample. When doing such, it can be important that the sample be completely flat or planar so that measurements or other analysis performed is accurate. While many samples, such as semiconductor substrates or "wafers", may look flat upon initial observation, such samples can have a relatively high degree of warpage.

Several different types of sample support structures are commonly used in the semiconductor industry to secure and flatten a wafer to the support structure during processing. One such support structure is an electrostatic chuck that includes one or more electrodes beneath the surface that supports the sample. If the sample is electrically conductive, a voltage can be applied to the electrodes to clamp and flatten the sample to the chuck. Electrostatic chucks can be very effective at flattening wafers that are slightly or even moderately warped but can be less effective or unable to flatten highly warped wafers.

Another type of support structure is a vacuum chuck that applies a vacuum to the backside of the sample to both clamp and flatten the sample to the chuck. Vacuum chucks can be very effective at securing and flattening wafers, including some highly warped wafers that cannot be flattened by electrostatic chucks, but vacuum chucks cannot be used to secure or flatten wafers in sample processing chambers that process substrates at vacuum pressures.

While many variations of electrostatic chucks and vacuum chucks have been designed over the years, some previously designed chucks have a limited capability in supporting and fully planarizing wafers that have a high degree of warpage within a sample processing chamber held at vacuum pressure during a substrate processing operation as described above. Accordingly, new and improved systems for flattening warped samples and supporting such samples in a substrate processing tool are desirable.

BRIEF SUMMARY OF THE INVENTION

Embodiments described herein provide methods and systems for supporting, flattening and then processing samples, including highly warped substrates or wafers. While embodiments of the disclosure can be used to support and flatten many different types of samples that can have varying degrees of warpage prior to performing a processing operation within a vacuum chamber, some embodiments are particularly useful for supporting and flattening large thin wafers, such as semiconductor wafers, that can be highly warped and thus cannot be flattened by some traditional electrostatic chucks.

As described herein, it can be important for certain processing operations performed on samples that the samples be completely flat. For example, when imaging various locations on a wafer with a scanning electron microscope (SEM) tool, it can be important that the working distance between the column tip and sample be precisely known. Thus, towards this end, methods and systems described herein flatten the sample prior to performing a processing operation on the sample (e.g., an SEM imaging operation) within a vacuum chamber. In some embodiments, the sample is flattened in a load lock or similar chamber prior to being transferred into the substrate processing chamber. In other embodiments, the sample is transferred into a main processing chamber and subsequently flattened within the main processing chamber prior to performing the substrate processing operation. In still other embodiments, the processing chamber includes a main chamber area in which the sample is processed and a separate, smaller chamber arca (sometimes referred to herein as an "auxiliary volume") that is sealed off from the main chamber. The sample can be moved into and initially flattened in the axillary volume before being moved back into the main processing area prior to performing the substrate processing operation. Details of each of these embodiments are set forth below.

While some embodiments of the methods and systems disclosed herein are particularly useful for flattening warped wafers prior to performing an imaging operation in a vacuum chamber of an SEM tool, embodiments are not limited to any particular type of substrate processing operation or type of substrate processing tool. Embodiments described herein can be used to secure and flatten samples prior to processing the sample in other types of sample processing tools that processes samples in a high, very high or ultra high vacuum environment.

According to some embodiments, a method of processing a substrate is disclosed where the method comprises: positioning the substrate on an upper surface of a substrate holder in a first chamber, wherein the substrate holder comprises one or more vacuum channels disposed at the upper surface and one or more electrodes disposed within the substrate holder proximate to the upper surface; while the substrate holder is within the first chamber, clamping and flattening the substrate to the substrate holder by applying a vacuum to the one or more vacuum channels; while the substrate is clamped to the substrate holder via the one or more vacuum channels, applying a voltage to the one or more electrodes to further clamp the substrate to the substrate holder with an electrostatic force; pumping out the first chamber to a vacuum pressure while continuing to clamp the substrate to the substrate holder with electrostatic force; while the substrate is clamped to the substrate holder by electrostatic force, transferring the substrate holder from the first chamber into a second chamber under vacuum conditions; and while the substrate holder is within the second chamber, maintaining the electrostatic force clamping the substrate to the substrate holder, and processing the substrate in the second chamber at a vacuum pressure.

In various implementations, methods according to embodiments disclosed herein can include one or more of the following. The first chamber can be a load lock chamber. Clamping and flattening the substrate to the substrate holder by applying a vacuum to the one or more vacuum channels can be done while the load lock chamber is at atmospheric pressure. The second chamber can be a process chamber comprising a scanning electron microscope. Processing the substrate in the second chamber can include imaging the substrate with a scanning electron microscope. After processing the substrate in the processing chamber under vacuum conditions, the method can further include transferring the substrate holder with the substrate positioned thereon, back to the load lock chamber. The substrate can have a warpage of at least 1.0 millimeters between a lowest point and a highest point on the substrate. The vacuum pressure that the sample is processed at in the second chamber can be a high vacuum pressure or lower. The one or more electrodes can comprise at least two electrodes arranged in an interleaved pattern with each other. The substrate can be a semiconductor wafer.

In some embodiments, a system for processing a substrate is disclosed. The system can include: a main substrate processing chamber; a load lock chamber; a first, external transport unit configured to transfer a substrate between the load lock chamber and a front opening unified pod (FOUP); a second, internal transport unit configured to transfer the substrate between the load lock chamber and the main substrate processing chamber; a processor and a memory coupled to the processor. The memory can include a plurality of computer-readable instructions that, when executed by the processor, cause the system to: transfer the substrate into the load lock chamber with the first, external transfer unit and position the substrate on an upper surface of a substrate holder in the load lock chamber, wherein the substrate holder comprises one or more vacuum channels disposed at the upper surface and one or more electrodes disposed within the substrate holder proximate to the upper surface; while the substrate holder is within the load lock chamber, clamp and flatten the substrate to the substrate holder by applying a vacuum to the one or more vacuum channels; while the substrate is clamped to the substrate holder via the one or more vacuum channels, apply a voltage to the one or more electrodes to further clamp the substrate to the substrate holder with an electrostatic force; pump out the load lock chamber to a vacuum pressure while continuing to clamp the substrate to the substrate holder with electrostatic force; transfer the substrate and substrate holder, under vacuum conditions, from the load lock chamber into the main processing chamber with the second, internal transfer unit; and while the substrate is clamped to the substrate holder by electrostatic force, process the substrate in the main processing chamber at a vacuum pressure.

In still additional embodiments, a non-transitory computer-readable memory is disclosed. The computer-readable memory can store instructions for processing a substrate by: positioning the substrate on an upper surface of a substrate holder in a first chamber, wherein the substrate holder comprises one or more vacuum channels disposed at the upper surface and one or more electrodes disposed within the substrate holder proximate to the upper surface; while the substrate holder is within the first chamber, clamping and flattening the substrate to the substrate holder by applying a vacuum to the one or more vacuum channels; while the substrate is clamped to the substrate holder via the one or more vacuum channels, applying a voltage to the one or more electrodes to further clamp the substrate to the substrate holder with an electrostatic force; pumping out the first chamber to a vacuum pressure while continuing to clamp the substrate to the substrate holder with electrostatic force; transferring the substrate and substrate holder from the first chamber into a second chamber under vacuum conditions; and while the substrate is clamped to the substrate holder by electrostatic force, processing the substrate in the second chamber at a vacuum pressure.

To better understand the nature and advantages of the present disclosure, reference should be made to the following description and the accompanying figures. It is to be understood, however, that each of the figures is provided for the purpose of illustration only and is not intended as a definition of limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Figure 1:
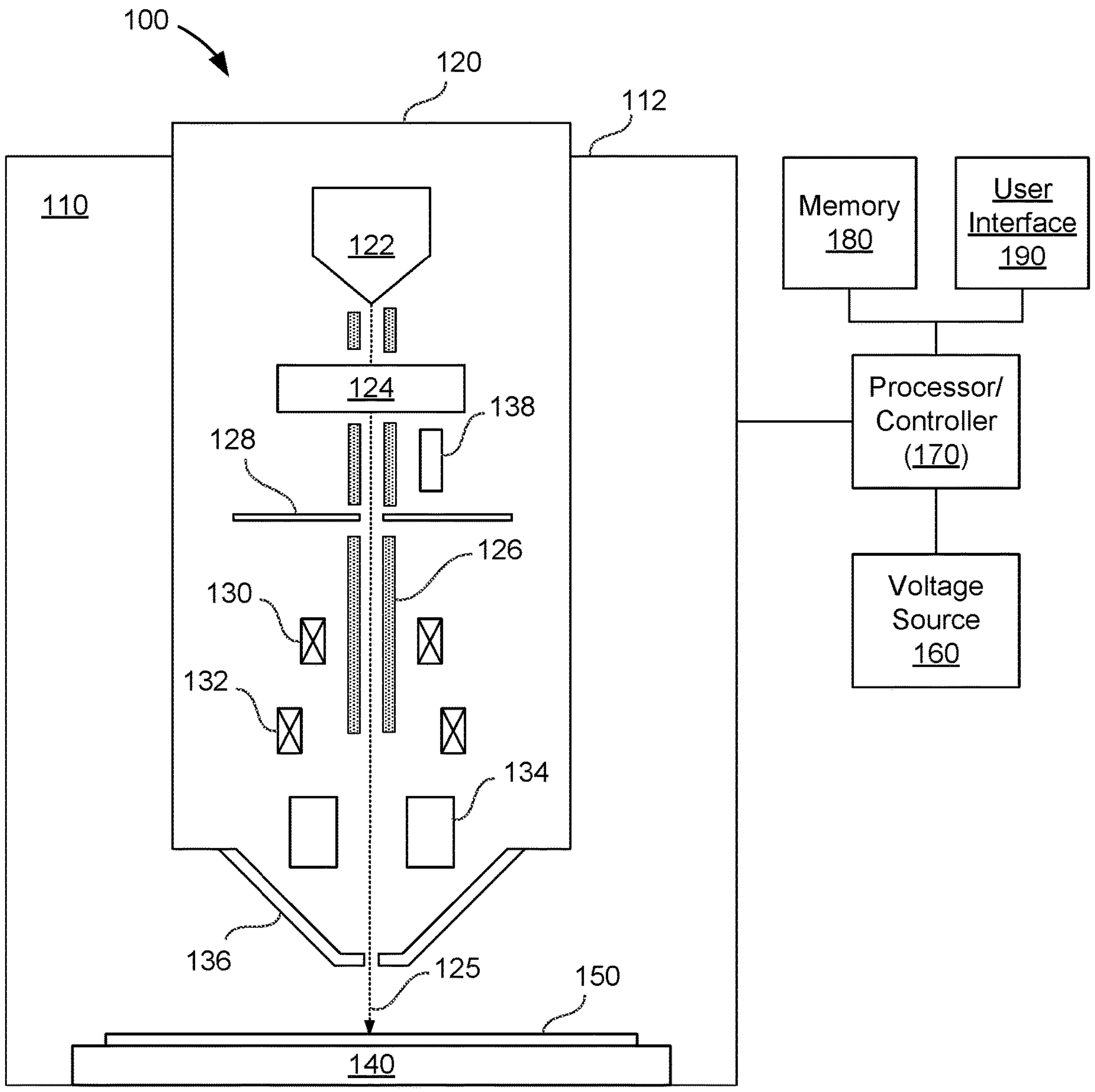
FIG. 1 (Prior Art)
FIG. 1 is simplified illustration of a sample evaluation system that includes a scanning electron microscope (SEM) column.

Embodiments described herein provide methods and systems for supporting, flattening and then processing samples, including highly warped substrates or wafers. While embodiments of the disclosure can be used to support and flatten many different types of samples that can have varying degrees of warpage prior to performing a processing operation within a vacuum chamber, some embodiments are particularly useful for supporting and flattening large thin wafers, such as semiconductor wafers, that can be highly warped and thus cannot be flattened by some traditional electrostatic chucks.

As described above, it can be important for certain processing operations performed on samples, such as semiconductor wafers, that the samples be completely flat. Embodiments described herein provide methods and systems for supporting, flattening and then processing samples, including highly warped substrates or wafers prior to performing a processing operation on the sample (e.g., prior to performing an SEM imaging operation within a vacuum chamber on various regions of interest at different locations on the sample). In some embodiments, the sample is flattened in a load lock or similar chamber prior to being transferred into the substrate processing chamber. In other embodiments, the sample is transferred into a main processing chamber and subsequently flattened within the main processing chamber prior to performing the substrate processing operation. In still other embodiments, the processing chamber includes a main chamber area in which the sample is processed and a separate, smaller chamber area (sometimes referred to herein as an "auxiliary volume") that is sealed off from the main chamber. The sample can be moved into and initially flattened in the auxiliary volume before being moved back into the main processing area prior to performing the substrate processing operation. Details of each of these embodiments are set forth below.

While embodiments of the disclosure can be used to support and flatten many different types of samples that can have varying degrees of warpage prior to performing a processing operation within a vacuum chamber, some embodiments are particularly useful for supporting and flattening large thin wafers, such as semiconductor wafers, that can be highly warped and thus cannot be flattened by some traditional electrostatic chucks. Also, while some embodiments of the methods and systems disclosed herein are particularly useful for flattening warped semiconductor or dielectric wafers prior to performing an imaging operation in a vacuum chamber of an SEM tool, embodiments are not limited to any particular type of substrate processing operation or type of substrate processing tool. Embodiments described herein can be used to secure and flatten large wafers (and other types of samples) prior to processing the wafer (or sample) in other types of sample processing tools that require a high, very high or ultra high vacuum environment for the processing operation.

Example Sample Evaluation Tool

In order to better understand and appreciate the disclosure, reference is first made to FIG. 1, which is a simplified schematic illustration of a previously known sample evaluation system 100. Sample evaluation system 100 can be used for, among other operations, defect review and analysis of structures formed on samples, such as semiconductor or dielectric wafers.

System 100 can include a vacuum chamber 110 along with a scanning electron microscope (SEM) column 120. A supporting element 140 can support a sample 150 (e.g., a semiconductor wafer) within chamber 110 during a processing operation in which the sample 150 (sometimes referred to herein as an "object" or a "specimen") is subject to a charged particle beam 126 from the SEM column.

SEM column 120 is connected to vacuum chamber 110 so that charged particle beam generated by the column propagates through a vacuumed environment formed within vacuum chamber 110 before impinging on sample 150. SEM column 120 can generate an image of a portion of sample 150 by illuminating the sample with charged particle beam 125, detecting particles emitted due to the illumination, and generating charged particle images based on the detected particles. Towards this end, SEM column 120 can include an electron beam source 122 (i.e., an "electron gun"), an anode tube 126 that defines the electron beam drift space, a condenser lens arrangement 124, one or more deflecting lenses, such as lenses 130, 132, one or more focusing lenses 134, and a column cap 136.

During an imaging process, electron beam source 122 generates an electron beam 125 that passes through and is initially converged by the condenser lens 124 and then focused by lenses 134 before hitting the sample 150. Condenser lens 124 defines the numerical aperture and current of the electron beam (together with the final aperture) which is directly related to the resolution, while focusing lenses 134 focus the beam onto the sample. Column cap 136, which is located between the lower end of anode tube 126 (a first electrode) and the sample 150 (a second electrode) can be a third electrode in the system that regulates the electric field created within the vicinity of the wafer.

FIG. 1 depicts SEM column 120 generating a charged particle beam 125 that is generally orthogonal to sample 150 when the beam collides with the sample. In various embodiments, SEM column 120 can be operated in a tilted mode where charged particle beam 125 collides with sample 150 at a non-vertical angle, such as a 45-degree angle.

In both regular and tilted modes, the particle imaging process typically includes scanning a charged particle beam back-and-forth (e.g., in a raster or other scan pattern) across a particular area of the sample being imaged. Deflecting lenses 130, 132, which can be magnetic lenses, electrostatic lenses or a combination of both electrical and magnetic lenses, can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

SEM column 120 can also include one or more detectors to detect charged particles generated from the sample during an imaging process. For example, SEM column 120 can include an in-lens detector 128 and a top detector 138 that can be configured to detect secondary and backscattered electrons emitted as a result of an illumination of the sample by charged particle beam 126. In-lens detector 128 can include a central hole that allows charged particle beam 126 to pass through the detector and allows both secondary electrons and backscattered electrons that enter the charged particle column 120 to pass through detector 128 to top detector 138. In some embodiments, sample evaluation system 120 can also include an external detector that can also be configured to detect secondary and backscattered electrons or that can be configured to detect x-rays, such as x-ray spectroscopy (EDX) detector.

During operation of system 100, support element 140 can move the sample such that different portions (e.g., different regions of interest or "ROIs") are positioned directly under the field of view of SEM column 120. Support element 140 can move sample 150 within chamber 110 relatively rapidly both left and right and forward and back (i.e., along both the X and Y axis) and can also raise and lower sample 150 thus moving the sample along the Z axis.

Since many features formed on sample 150 have dimensions at the micron size or smaller, it is important that location of the sample relative to the focal point of SEM column 120 be precisely known. In order to precisely determine the location of sample 150, a highly accurate navigation, interferometry system (not shown) can be used in some embodiments. The interferometry system can be mounted on a lid 112 of chamber 110 and direct collimated light (e.g., a laser beam) through a window (not shown) formed on the lid to a target area on support element 140 that is encoded with various linear or other marks. The system can detect light (e.g., with an array of photodetectors) from the collimated light pulses after being reflected off the encoded target area of support element 140 back to the interferometry system. Then, a processor within the interferometry system (e.g., digital signal processor) can analyze the detected light signals to determine a highly accurate location of the sample along the X and Y axis.

Additionally, system 100 can include a voltage supply source 160 and one or more controllers 170, such as a processor or other hardware unit. Voltage supply source 160 can be operated to provide a desired effective voltage of the column to thereby improve the image resolution. This can be achieved by appropriate distribution of the voltage supply between the first and second electrodes (i.e., between the anode tube and the sample). Controller(s) 170 can control the operation of system, including the voltage supply source, by executing computer instructions stored in one or more computer-readable memories 180 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

System 100 can further include a user interface 190 that can enable one or more users to interact with the system. For example, user interface 190 can allow a user to set parameters of the SEM column or the detectors that can be used when analyzing a sample. The user interface 190 can include any known device or devices that enable a user to input information to interact with a computer system such as a keyboard, a mouse, a monitor, a touch screen, a touch pad, a voice activated input controller and the like.

Transferring Samples Into Processing Chamber 110

In order to process samples 150 within chamber 110, the samples first need to be transferred into the chamber. While not illustrated in the figures of the present application, some substrate processing systems include a factory interface that allows cassettes of wafers to be processed to be loaded into a docking station. The docking station can include one or more front opening unified pods (FOUPS) that are standard in the industry to temporarily hold the wafers as each awaits its turn to be processed. A first, external transfer unit (ETU) that is part of the processing system and operates between the docking station and a load lock chamber can pick up an individual wafer from the FOUPS and transfer the wafer to the load lock chamber. The docking station and FOUPS are typically at atmospheric pressure.

Processing chamber 110 operates at a high, very high or even ultra high vacuum pressure. The load lock chamber, which generally has a much smaller volume than the processing chamber, can be pumped up and down between atmospheric and high vacuum levels as appropriate much faster than the processing chamber. For example, a wafer can be transferred into the load lock chamber from a FOUP at atmospheric pressure. The load lock chamber can then be pumped down to vacuum and a second, internal transfer unit (ITU) that is part of the processing system and operates between the load lock chamber and the processing chamber can pick up the wafer from the load lock chamber and transfer the wafer to the processing chamber without breaking vacuum (i.e., while the load lock chamber and processing chamber are maintained at vacuum pressure). Each of the first and second transfer units can be, for example, a robot arm having an end effector specifically designed to pick up and transfer semiconductor wafers or similar samples from one location to another within a processing tool or station.

Once inside the processing chamber, the sample can be processed and then transferred back to the load lock chamber without breaking vacuum. The load lock chamber can then be vented to atmosphere and an ITU can pick up the processed sample so that it can be transferred to a subsequent stage of the manufacturing or evaluation process. The use of a load lock chamber in such a manner allows the main processing chamber to be maintained at a high or ultra high vacuum pressure while sequentially processing many hundreds or thousands of substrates without venting the processing chamber to atmosphere.

Figure 2A:
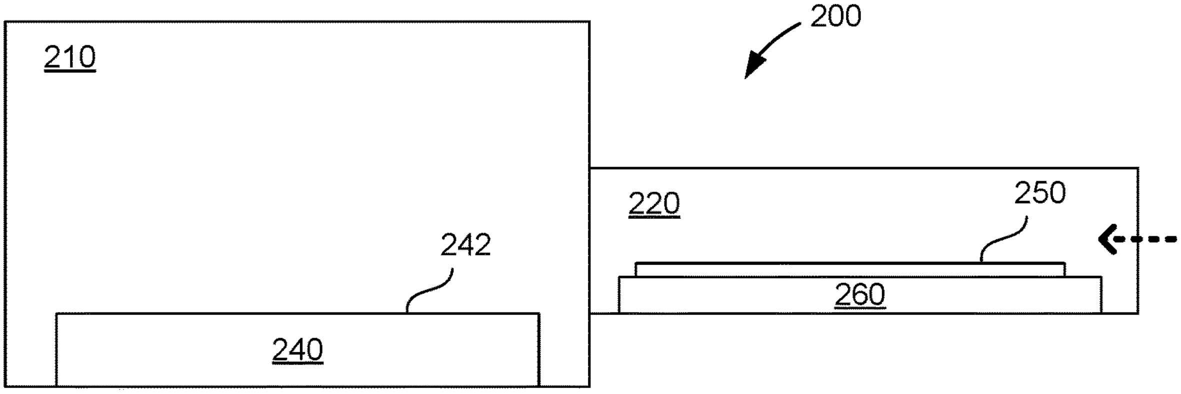
FIG. 2A (Prior Art)
FIGS. 2A to 2C are simplified block diagrams of a sample evaluation system that includes a substrate processing column and a load lock chamber.
Figure 2B:
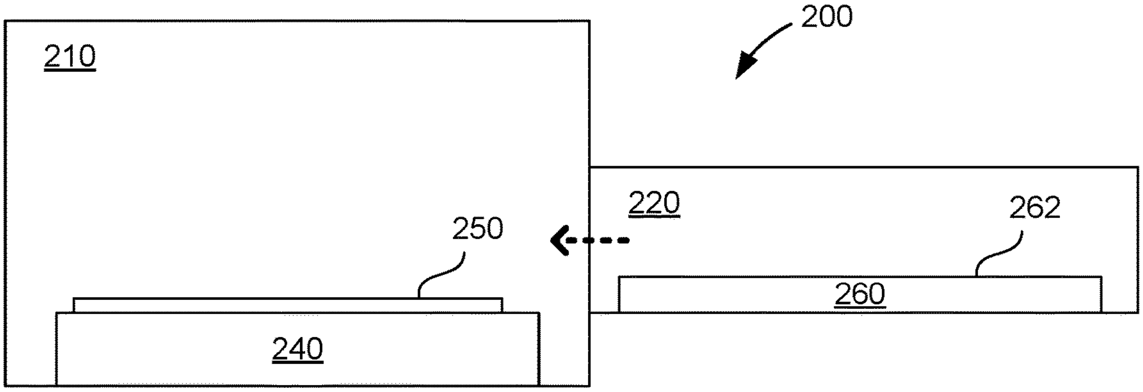
FIG. 2B (Prior Art)
Figure 2C:
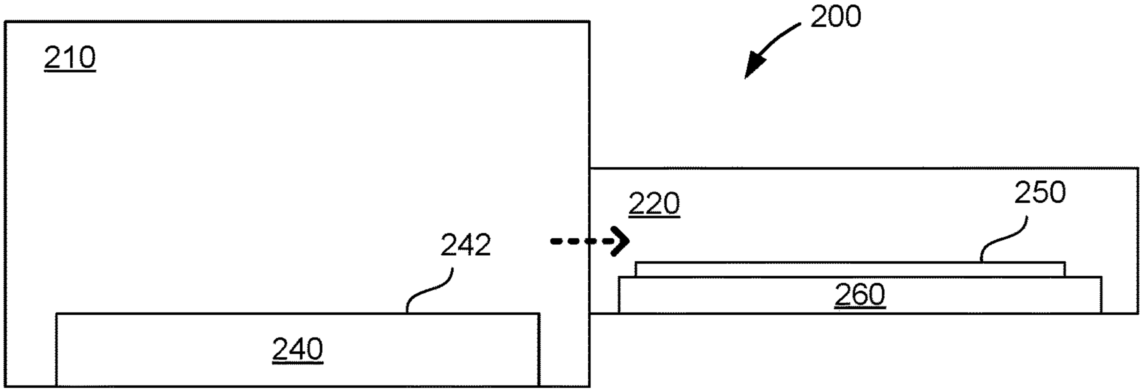
FIG. 2C (Prior Art)

FIGS. 2A to 2C are simplified block diagrams of a previously known substrate processing system 200 that includes a substrate processing chamber 210 and a load lock chamber 220. Substrate processing chamber 210 can be representative of substrate processing chamber 110, but for case of illustration, SEM column 120 and other components that are part of processing chamber 110 are not shown in FIG. 2A or 2B. Substrate processing system 200 can also include additional components, such as a docking station, one or more FOUPS and various transfer units (e.g., ETUs, ITUs and other robots) as discussed above, which are also not shown for case of illustration.

As shown in each of FIGS. 2A to 2C, substrate processing chamber 210 can include a sample support element 240 that can support a sample 250 (e.g., a semiconductor wafer) within chamber 210 during a processing operation in which the sample 250 is subject to a charged particle beam from the SEM column (not shown). Support element 240 and sample 250 can be representative of support element 140 and sample 150 discussed above with respect to FIG. 1.

Load lock chamber 220 can also include a sample support element 260 that can support sample 250 while it is positioned within the load lock chamber. Each of sample support elements 240 and 260 can include an upper support surface 242, 262, respectively, and lift pins (not shown) that allow the sample to be raised above the upper support surface so that a transfer unit can slide under the sample and transfer the sample onto or off of the supporting element as is known to those of skill in the art.

In order to process sample 250 within processing chamber 210, the sample can first be transferred into load lock chamber 220 (as indicated by the dashed arrow) and positioned on sample support 260 as shown in FIG. 2. This operation can be performed, for example, by a first transfer unit that picks the sample 250 out of a FOUP and transfers the sample into load lock chamber 220 while the load lock chamber is at atmospheric pressure. The chamber can then be pumped down to an appropriate vacuum pressure and a second transfer unit can transfer sample 250 out of load lock chamber 220 into processing chamber 210 (as indicated by the dashed arrow in FIG. 2B) while both chambers are held at vacuum.

After processing is complete, sample 250 can then be transferred out of processing chamber 210 and back into load lock chamber 220 (as indicated by the dashed arrow in FIG. 2C) while both chambers are still held at vacuum.

Figure 3A:
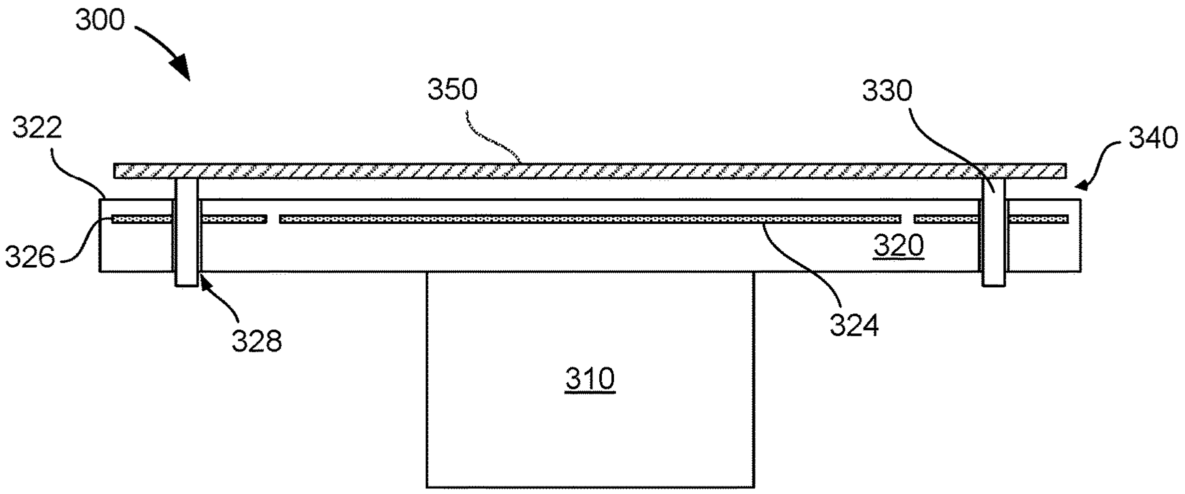
FIG. 3A (Prior Art)
FIGS. 3A and 3B are simplified cross-sectional views of a previously known electrostatic chuck with lift pins in up and down positions, respectively.
Figure 3B:
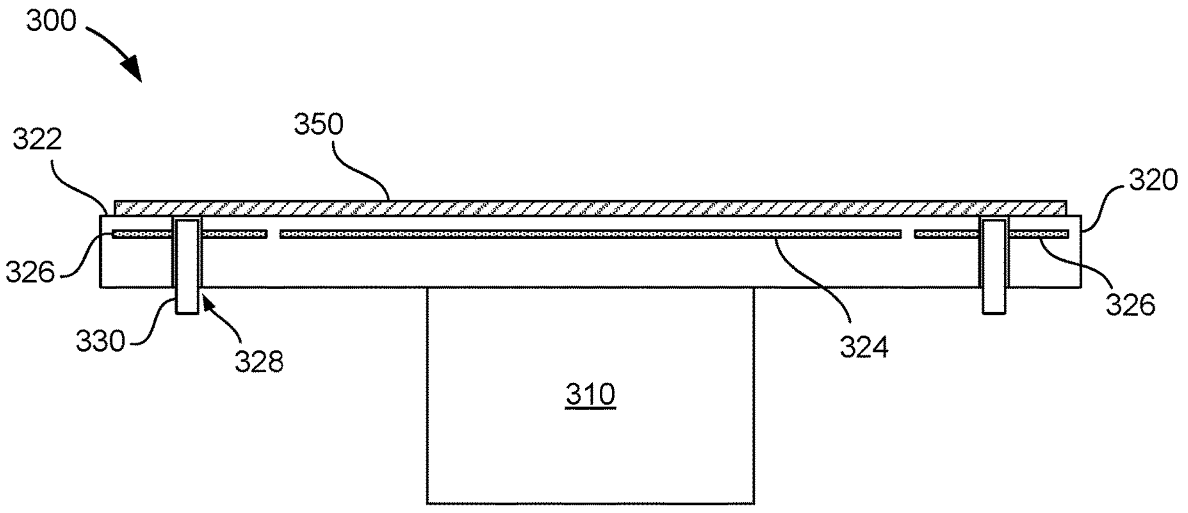
FIG. 3B (Prior Art)

In some previously known systems, support element 240 can be an electrostatic chuck that applies a voltage to one or more electrodes disposed beneath surface 242 to clamp and flatten sample 250 to the support element 240. FIGS. 3A and 3B are simplified illustrations of a previously known electrostatic chuck 300 that can be representative of support element 240 and that some previously known sample evaluation system uses to support electrically conductive samples, such as semiconductor wafers, in a vacuum chamber during a sample evaluation process.

Referring first to FIG. 3A, electrostatic chuck 300 includes a moveable stage 310 coupled to a support plate 320. Support plate 320 has a planar support surface 322 on which a sample 350 (e.g., a wafer such as a semiconductor wafer) can be positioned during an evaluation or other type of analysis operation.

Stage 310 can move support plate 320 (and thus move sample 350) within vacuum chamber 110 in the X, Y and Z directions in order to position a region of interest on the sample directly beneath the field of view of a charged particle column, such as charged particle column 120. Plate 320 can be made from a dielectric material, such as a ceramic material, and one or more electrodes 324, 326, can be disposed beneath surface 322. When sample 350 is a semiconductor wafer or other electrically conductive sample, a voltage can be applied to the electrodes 324, 326 to clamp the sample to the planar support surface 322 as shown in FIG. 3A securing the sample to the support plate 320 so that the sample will not shift or otherwise move when stage 310 moves the sample support within vacuum chamber 110. As long as any warpage of sample 350 is within certain limits, clamping sample 350 in this manner can also beneficially, flatten the sample to ensure an accurate working distance across all regions of the sample.

Support plate 320 can also include multiple lift pin holes 328 and a corresponding number of lift pins 330 to facilitate transfer of the sample 350 into and out of a sample evaluation system. As shown in FIGS. 3A and 3B, each lift pin hole 328 can extend entirely through support plate 320. And, while not shown in FIG. 3A or 3B, the lift pins 330 can be attached in a fixed position with respect to a portion of stage 310 so that the lift pins can move in the X and Y directions with support plate 320 while at the same time allowing stage 310 to raise and lower the support plate 320 in the Z direction without moving lift pins 330. In this manner, support plate 320 can be lowered so that a distal end of each lift pin 330 protrudes through its respective lift pin hole 328 holding the sample 350 above upper surface 322 of support plate 320 thereby creating a gap 340 between upper surface 322 of support plate 320 and a bottom surface of sample 350 as shown in FIG. 3A. When the chuck is then sufficiently raised (e.g., to the position shown in FIG. 3B, each lift pin 330 recedes into its respective lift pin hole 328 of the support plate 320 and the sample 350 rests on upper surface 322.

Having the lift pins 330 in the raised position shown in FIG. 3A allows an ITU or similar substrate transfer device (not shown) to transfer sample 350 into the vacuum chamber, drop the sample onto lift pins 330 and retract out of the vacuum chamber. Support plate 320 can then be raised to position the sample 350 on upper surface 322 and one or more regions on the sample can be evaluated or otherwise analyzed as discussed above. Once the evaluation processes are completed on a given sample 350, the support plate can be lowered such that sample 350 is lifted onto lift pins 330 and the gap 340 that is created between the sample and support surface 322 enables the ITU (not shown) to pick sample 350 up off the lift pins and transfer the sample out of the chamber.

While two lift pin holes 328 and two corresponding lift pins 330 are shown in the cross-sectional views of FIGS. 3A and 3B, a typical electrostatic chuck 300 will include at least three lift pin holes 328 and three lift pins 330 that are disposed at intervals around a periphery of support plate 320. For example, in some implementations, electrostatic chuck 300 can include three lift pin holes 328 and three lift pins 330 spaced apart from each other at 120-degree angles.

Challenges Processing Highly Warped Samples

As shown in FIGS. 1, 2 and 3A, 3B, the samples 150, 250, 350 processed within systems 100, 200 are thin, flat wafers, such as semiconductor or dielectric wafers. All such samples have some degree of warpage (i.e., the samples have, at some level, a convex or concave shape) where warpage is defined as the difference between the lowest point on the sample and the highest point on the sample when the sample is positioned on a flat surface without being clamped or otherwise secured to the surface.

Due to the usage of non-silicon wafers and new fabrication techniques, as well as the fact that semiconductor and other wafers have gotten larger over the years, the amount of warpage has generally increased to the point that some wafers have at least several hundred microns of warpage and others can have up to several millimeters of warpage. Some existing electrostatic chucks, such as chuck 300 discussed above, are not able to completely flatten wafers once the warpage is above a certain threshold. To illustrate, reference is made to FIGS. 4A and 4B in which FIG. 4A is a simplified cross-sectional view of the electrostatic chuck 300 discussed above supporting a highly warped sample 450, and FIG. 4B is an expanded view of a portion of chuck 300 and sample 450.

Figure 4A:
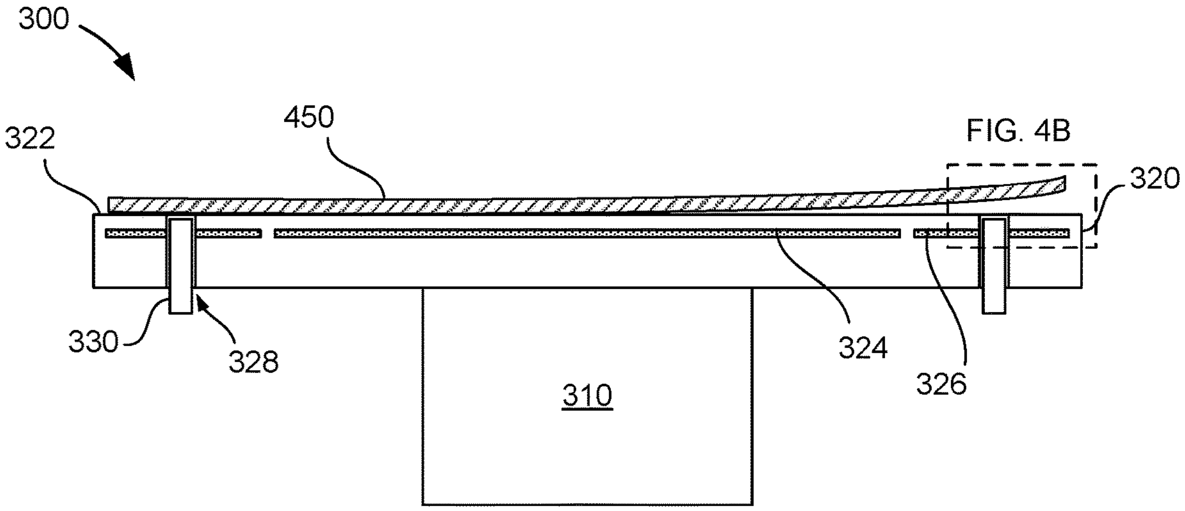
FIG. 4A (Prior Art)
FIG. 4A is a simplified cross-sectional view of the electrostatic chuck shown in FIGS. 3A and 3B supporting a highly warped sample.
Figure 4B:
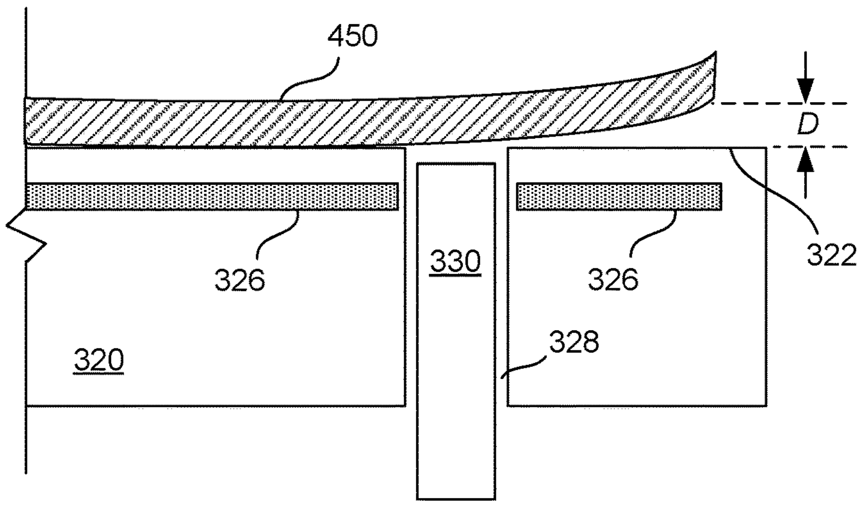
FIG. 4B (Prior Art)
FIG. 4B is an expanded view of a portion of the electrostatic chuck and sample shown in FIG. 4A.

As shown in FIGS. 4A and 4B, sample 450 is convexly warped such that, when the sample is positioned on the upper surface 322 of the chuck, an outer edge of sample 450 is spaced apart from surface 322 by a distance D. When a high voltage is applied to electrodes 324, 326, electrostatic chuck 300 can flatten portions of sample 450 but when the warpage that creates distance D is too large, electrostatic chuck 300 is not able to completely flatten the sample. In such instances, when an SEM instrument, such as system 100, is used to image or otherwise evaluate sample 450, the working distance between the column tip and sample will vary at different locations across sample 450 which will adversely impact the accuracy of images that are obtained.

The actual distance D at which a given wafer can no longer be fully flattened by a particular electrostatic chuck will depend on a number of factors including, among others, the material the wafer is made from, the size of the wafer, the type/model of the electrostatic chuck and the voltage levels applied to the electrodes. For some known electrostatic chucks, once the amount of warpage of a particular wafer is above several hundred microns, completely flattening the wafer with the electrostatic chuck using acceptable voltage levels might not be possible.

As stated above, it can be important for certain processing operations performed on wafers or other samples that the samples be completely flat. For example, as noted above, when imaging various locations on a wafer with a scanning electron microscope (SEM) tool, it can be important that the working distance between the column tip and sample be precisely known. Thus, towards this end, methods and systems described herein flatten the sample prior to performing a processing operation on the sample (e.g., an SEM imaging operation) within a vacuum chamber. As described in detail below, embodiments disclosed herein can secure and flatten a sample to be processed in a chamber under high or even ultra high vacuum conditions in several different ways. In some embodiments, the sample is flattened in a load lock or similar chamber prior to being transferred into the processing chamber. In other embodiments, the sample is transferred into a main processing chamber and subsequently flattened within the main processing chamber prior to performing the substrate processing operation (e.g., an SEM imaging operation). In still other embodiments, the processing chamber includes a main chamber area in which the sample is processed and a separate chamber area that is sealed off from the main chamber area in which the sample is initially flattened. Details of each of these embodiments are set forth below.

Hybrid Vacuum-Electrostatic Chuck Carrier

In some embodiments, instead of placing a sample directly on a sample support within the processing and load lock chambers, such as support elements 240 and 260, the sample is first positioned in the load lock chamber on a chuck carrier, which itself is positioned on a support structure. The chuck carrier can secure and flatten the sample using both vacuum chuck and electrostatic chuck techniques and is referred to herein as a hybrid vacuum-electrostatic chuck carrier. In operation, the hybrid chuck carrier can initially secure and flatten a sample in a load lock chamber with its vacuum chuck capability while the load lock chamber is at atmospheric pressure. Then, the hybrid chuck carrier can activate its electrostatic chuck capability to add electrostatic force to further secure the sample and the load lock chamber can be pumped down to vacuum leaving the sample flattened and clamped to the hybrid chuck carrier solely by electrostatic forces. With the sample secured and flattened, both the hybrid vacuum-electrostatic chuck carrier and the sample can be transferred with an ITU from the load lock chamber to the main processing chamber under vacuum and the sample can be processed within the main chamber at vacuum pressure while on the hybrid chuck carrier.

Figure 5A:
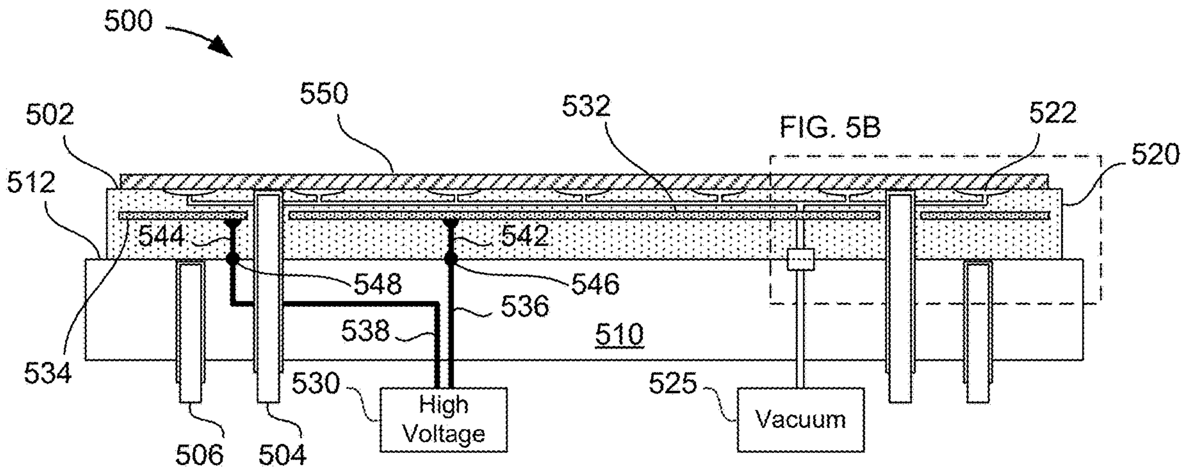
FIG. 5A is a simplified cross-sectional view of a hybrid vacuum-electrostatic chuck carrier according to some embodiments.

FIG. 5A is a simplified cross-sectional view of a sample support system 500 that includes a hybrid vacuum-electrostatic chuck carrier 520 (sometimes referred to herein as "chuck carrier 520") according to some embodiments and a platform 510. As shown, chuck carrier 520 has a sample 550 positioned on its upper surface 502 and the chuck carrier is positioned on an upper surface 512 of the platform 510, which could be in either a load lock chamber or a main processing chamber in place of either support elements 260 or 240, respectively. Each of surfaces 502, 512 can be generally planar and can be shaped similar to, but at least slightly larger than, sample 550.

Also shown in FIG. 5A are two sets of lift pins 504, 506, a vacuum system 525 and a high voltage system 530. Lift pins 504 allow the sample to be raised above upper support surface 502 so that a transfer unit can slide under the sample and transfer the sample onto or off of chuck carrier 520. Similarly, lift pins 506 allow chuck carrier 520 to be raised above platform 510 so that a transfer unit can slide under the chuck carrier and transfer the chuck carrier and the sample onto or off of platform 510.

Figure 5B:
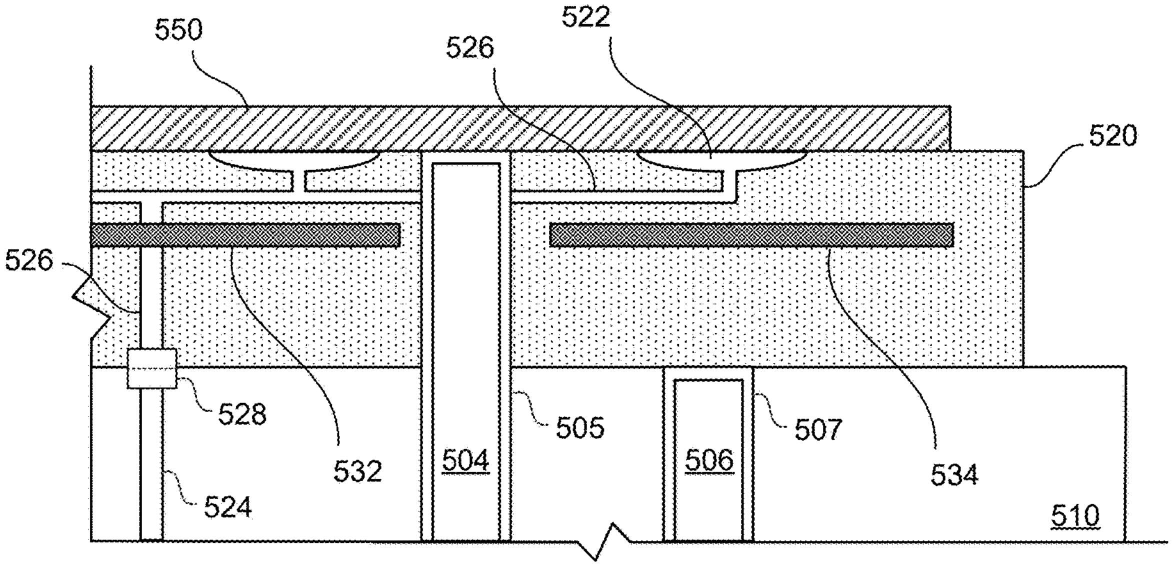
FIG. 5B is an expanded view of a portion of the hybrid vacuum-electrostatic chuck carrier shown in FIG. 5A.

As shown more clearly in FIG. 5B, which is an expanded view of a portion of chuck carrier 520, sample 550 and platform 510, each lift pin 504, 506 is positioned within a respective lift pin hole 505, 507. Lift pin holes 507 extend entirely through platform 510, while lift pin holes 505 extend entirely through both platform 510 and chuck carrier 520.

Chuck carrier 520 includes a plurality of vacuum channels 522 at its upper surface that can be operatively coupled to vacuum system 525 when the chuck carrier is positioned on platform 510. For example, a first vacuum line 524 that extends from vacuum system 525 through platform 510 can be fluidly coupled to a second vacuum line 526 that runs through chuck carrier 520 by a coupling 528. Each of the vacuum channels 522 is thus fluidly coupled to vacuum system 525 and operable to apply a vacuum to the back surface of sample 550 when vacuum system 525 is activated.

Chuck carrier 520 also includes a series of electrodes 532, 534 that are operatively coupled to high voltage source 530 when the chuck carrier is positioned on platform 510. Electrodes 532, 534 can be arranged in an interleaved or other pattern just beneath upper surface 502 as is known to those of skill in the art and can be driven at opposite charges (i.e., positive and negative charges) to induce an electrostatic field at the upper surface that can secure and clamp sample 550 to the chuck carrier. As shown, high voltage lines 536, 538 extend from high voltage source 530 through platform 510. Lines 536, 538 can be electrically coupled to high voltage lines 542, 544, respectively, that run through chuck carrier 520 by couplings 546, 548. Each series of electrodes 532, 534 is thus electrically coupled to high voltage system 530 and operable to generate electrostatic forces that clamp sample 550 to chuck carrier 520 when the high voltage source 530 is activated.

In operation, chuck carrier 520 is able to initially clamp and flatten sample 550 to its upper surface by activating vacuum system 525. Then, once sample 550 is flattened to chuck carrier 520, high voltage source 530 can activate electrodes 532, 534 to electrostatically clamp the sample to the chuck carrier and the vacuum applied by vacuum system 525 can be released. In this manner, chuck carrier can flatten some highly warped samples with its vacuum chuck that could not otherwise be completely flattened with an electrostatic chuck alone. Then, after the sample is chucked with electrostatic forces, the chuck carrier can be transferred into a main processing chamber.

Figure 6:
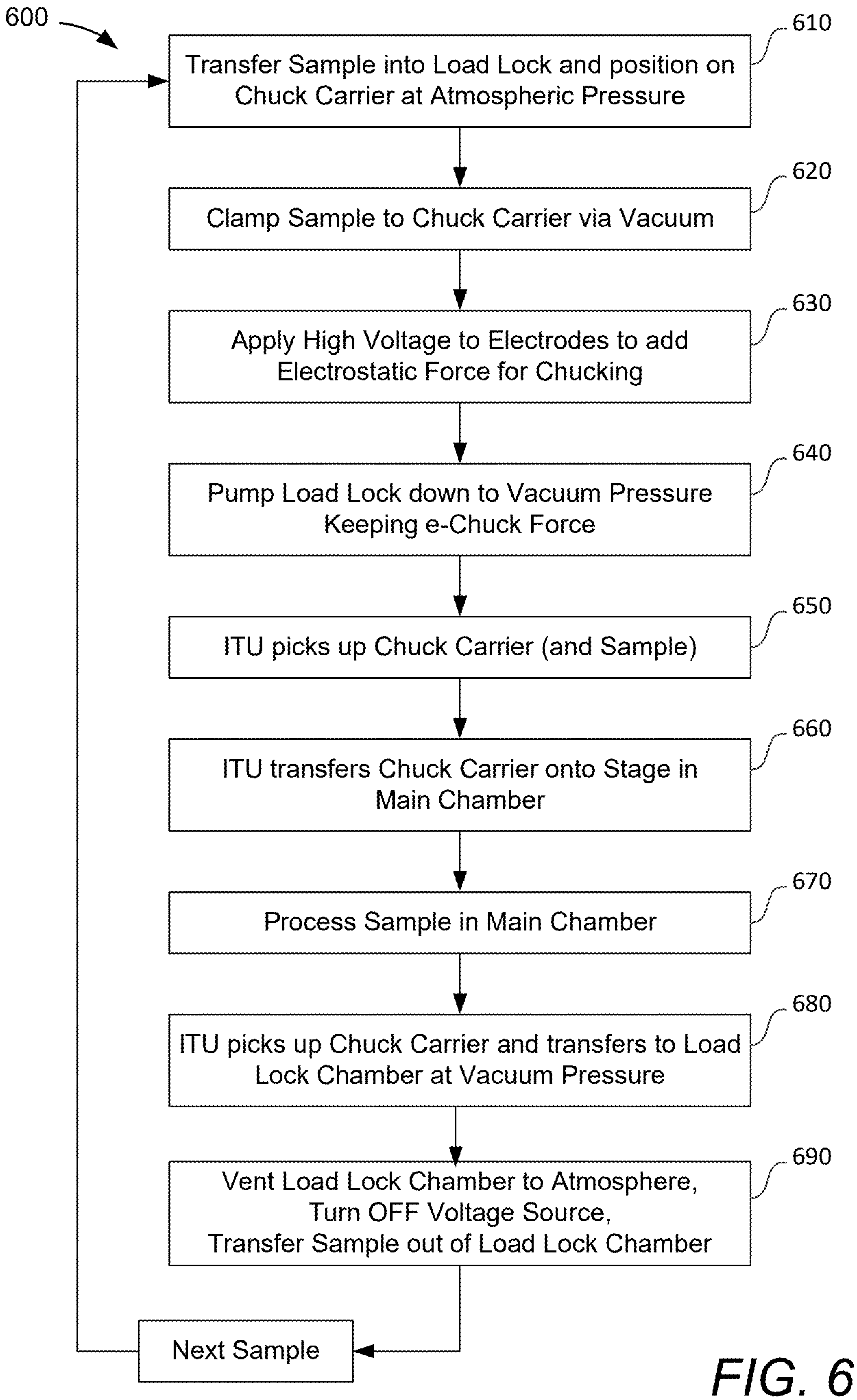
FIG. 6 is a flowchart depicting steps associated with a method of flattening and processing a warped substrate according to some embodiments.

In order to better understand and appreciate how hybrid vacuum-electrostatic chuck 520 can be used to flatten a sample, such as a highly warped substrate, for processing in a substrate processing chamber pumped down to high vacuum pressure levels or lower, reference is made to FIG. 6 and to FIGS. 7A to 7I. FIG. 6 is flowchart depicting steps associated with a method 600 of flattening and processing a warped substrate according to some embodiments. FIGS. 7A to 7I are simplified cross-sectional views of a substrate processing system 700 according to some embodiments depicted at different stages of flattening and processing a warped substrate according to the method set forth in FIG. 6.

As shown, substrate processing system 700 includes a main processing chamber 710 and a load lock chamber 720 and relies on a hybrid vacuum-electrostatic chuck carrier 765 to secure a sample 750 as the sample is transferred between the load lock and main processing chambers. Main processing chamber 710 can be similar to chambers 110, 210 in FIGS. 1 and 2A, 2B except that stage 740, which is adapted to accept a chuck carrier 765 replaces support element 140, 240. Load lock chamber 720 can be similar to load lock chamber 220 except that platform 760 replaces substrate support 260. Chuck carrier 520 can be representative of chuck carrier 765.

Figure 7A:
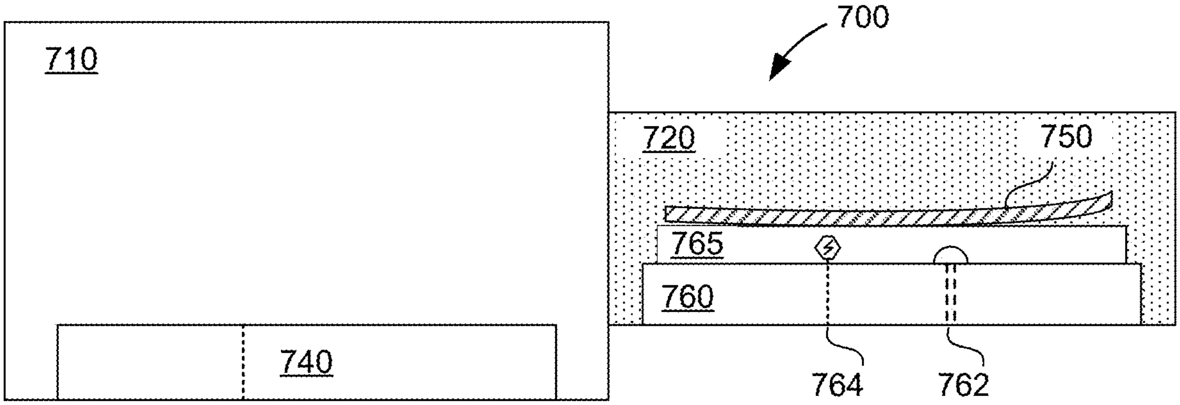
FIGS. 7A to 7I are simplified cross-sectional views of a substrate processing system according to some embodiments depicted at different stages of flattening and processing a warped substrate according to the method set forth in FIG. 6.

Referring first to FIG. 6 and FIG. 7A, method 600 starts by transferring a sample 750 into load lock chamber 720 and placing the sample on an upper support surface of hybrid vacuum-electrostatic chuck carrier 765 (FIG. 6, step 610). Chuck carrier 765 can be, for example, chuck carrier 520 discussed above and thus can secure the sample to its upper surface using either or both vacuum and electrostatic chucking. The chuck carrier can be positioned on, and mechanically clamped to, a platform 760 with any suitable clamping technique or mechanism (e.g., a releasable latch). Platform 760 can be, for example, platform 510 discussed above.

Platform 760 can both position and align the chuck carrier and sample by turning sample and carrier to a specific angle so that when a transfer unit picks up and places the carrier on the main chamber stage, the current sample being processed is in the same, known position as the previously processed sample and as samples to be processed subsequent to the current sample. Platform 760 includes a vacuum connection 762 and a high voltage connection 764 that can couple a vacuum system (not shown in FIG. 7A) and a high voltage source (also not shown), respectively, to corresponding connections on chuck carrier 765 when it is secured to platform 760. For example, vacuum connection 762 can be representative of vacuum line 524 and vacuum coupling 528 that couple vacuum system 525 to vacuum lines 526 within the chuck carrier. Similarly, high voltage connection 764 can be representative high voltage lines 536, 538 and high voltage couplings 546, 548 that couple high voltage source 530 to voltage lines 542, 544, respectively, within the chuck carrier.

While not shown in FIG. 7A, the transfer can be performed by an ETU that picks sample 750 up from a docking station (e.g., from a FOUP within a holding area of system 700) and places the sample onto lift pins (e.g., lift pins 504) that protrude above the upper surface of chuck carrier 765 within the load lock chamber. The lift pins can then be lowered such that the sample is supported by an upper surface of chuck carrier 765 as shown in FIG. 7A. This initial transfer step can take place while load lock chamber 720 is at atmospheric pressure as represented by the dotted background within chamber 720.

Figure 7B:
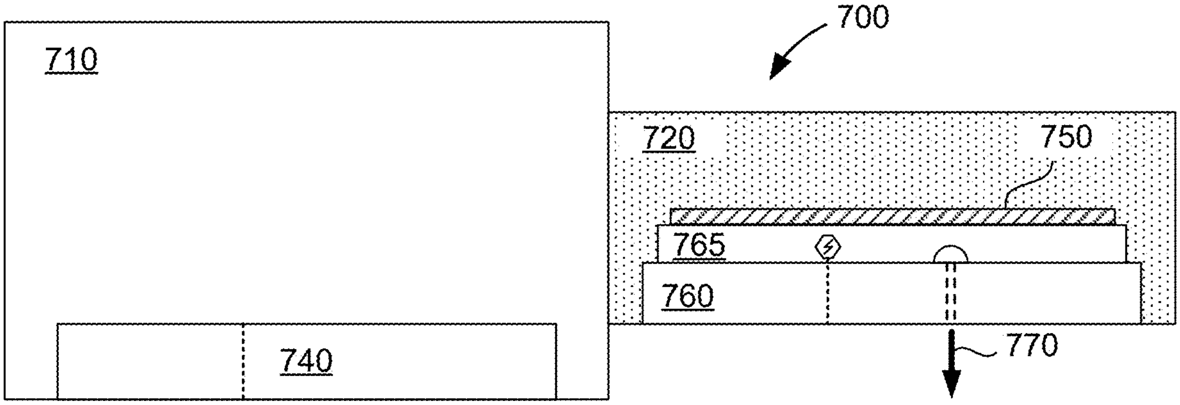
Figure 7C:
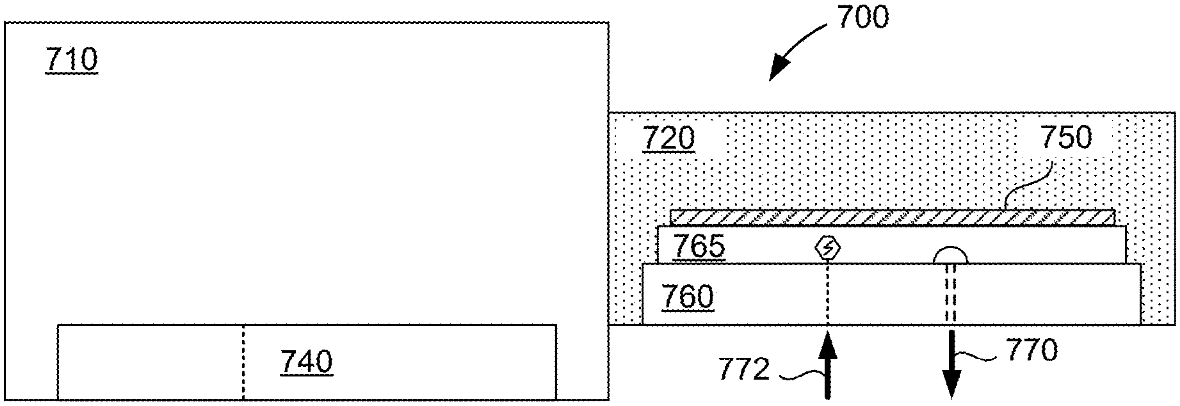

Next, the vacuum system can be activated as indicated by arrow 770 to create a vacuum suction force on the bottom of sample 750 (FIG. 6, step 620). Applying a vacuum to the backside of sample 750 while the load lock chamber is above vacuum pressure clamps the sample to the upper surface of chuck carrier 765 and flattens the sample as shown in FIG. 7B. While a vacuum is applied to the backside of sample 765 (and while the load lock chamber is still at atmospheric pressure), the high voltage source can be activated as indicated by arrow 772 in FIG. 7C to add an electrostatic force for further securing sample 750 to the chuck carrier 765 (FIG. 6, step 630).

Figure 7D:
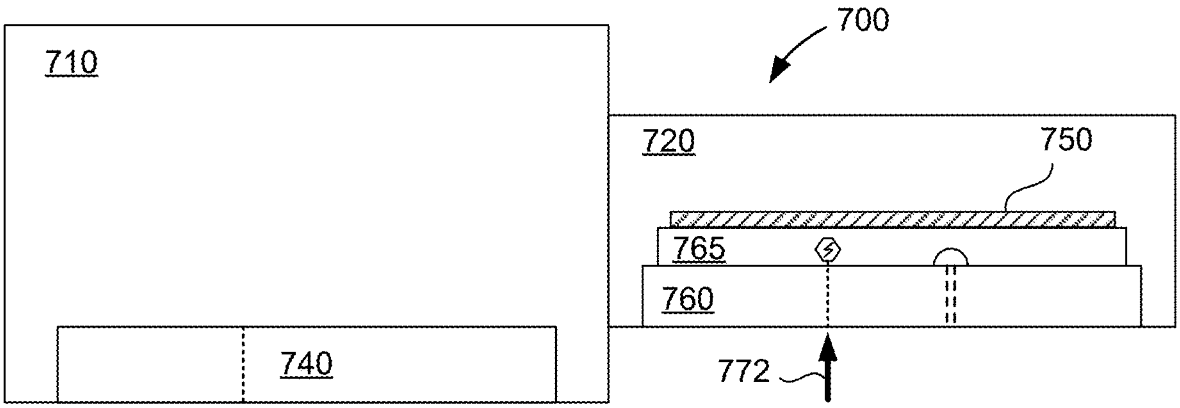

Load lock chamber 720 can then be pumped down to vacuum to match the pressure in main processing chamber 710 (e.g., a pressure equal to or between high vacuum pressure to ultra high vacuum pressure) and the vacuum system clamping sample 750 to chuck carrier 765 can be turned off as indicated by the absence of arrow 770 in FIG. 7D. The high voltage applied to the electrodes is maintained during this time (arrow 772) so that electrostatic force is the only force clamping sample 750 to the chuck carrier (FIG. 6, step 640).

As noted above, a vacuum chuck can sometimes flatten certain highly warped wafers that traditional electrostatic chucks are unable to completely flatten. Once the sample is chucked to chuck carrier 765 via the vacuum, however, the electrostatic chuck portion of chuck carrier 765 is able to maintain the sample in its flattened state. Thus, initially chucking sample 750 with a vacuum chuck and then switching the clamping force to an electrostatic force is able to keep some highly warped samples flattened that could not otherwise be flatted by the electrostatic force alone.

Figure 7E:
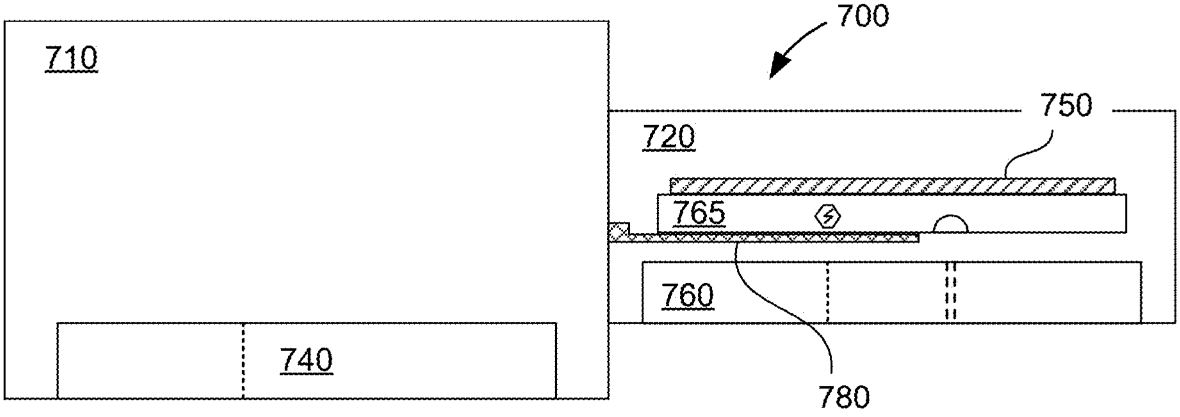
Figure 7F:
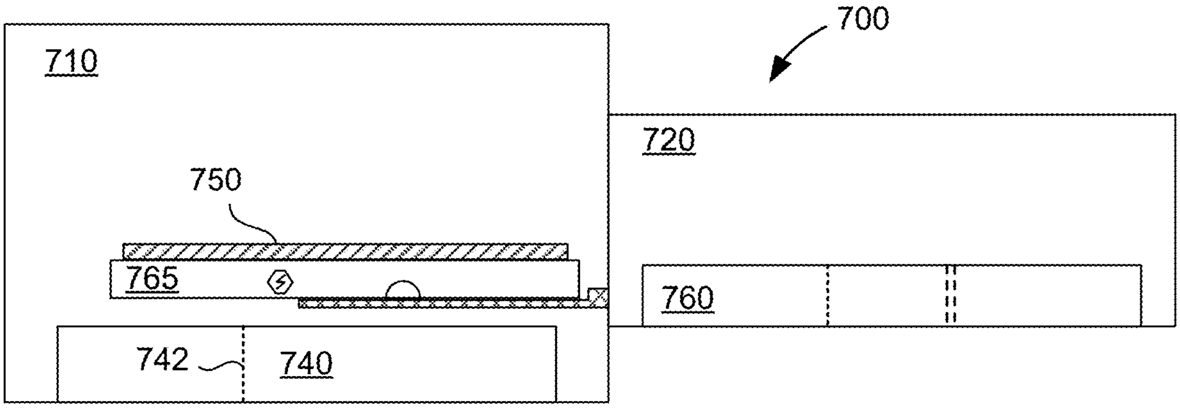
Figure 7G:
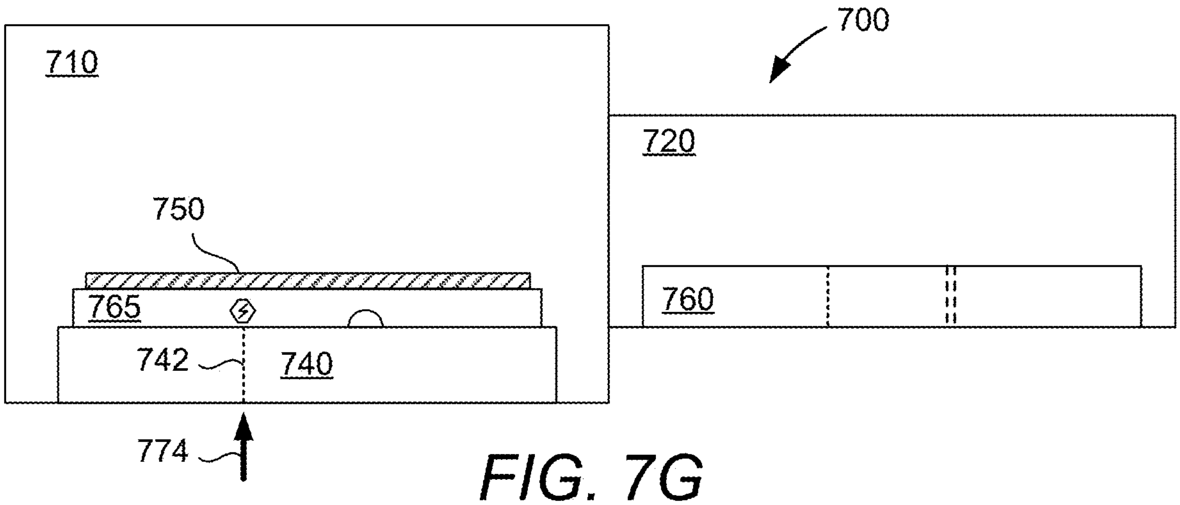

Next, a transfer unit 780 picks up chuck carrier 765, with sample 750 clamped to the chuck carrier via electrostatic forces, as shown in FIG. 7E (FIG. 6, step 650) and transfers the chuck carrier to stage 740 in main processing chamber 710, which is noted above can be at a high vacuum or lower pressure) as shown in FIG. 7F (FIG. 6, step 660). While not shown in FIGS. 7E, in order for transfer unit 780 to transfer the chuck carrier out of load lock chamber 720, the chuck carrier is first raised above the surface of platform 760 by lift pins (e.g., lift pins 506). Similarly, in order for the transfer unit to transfer the chuck carrier onto stage 740, the chuck carrier is placed on lift pins that extend above the surface of stage 740, the transfer unit is retracted, and the lift pins are slowly lowered into the body of stage 740 placing chuck carrier 765 (and sample 750) onto stage 740 as shown in FIG. 7G.

In the process of transferring chuck carrier 765 to stage 740, the chuck carrier is disconnected from voltage source 772, moved into processing chamber 710 and aligned with the stage 740 so that two high voltage lines (represented by a single dotted line 742) can be electrically coupled to corresponding lines in the chuck carrier (e.g., lines 536, 538). A high voltage connection (represented by arrow 774) is then made to voltage lines 742 to maintain the electrostatic force clamping sample 750 to the chuck carrier and thus maintain sample 750 in its flattened state.

Next, sample 750 can be processed in main chamber 710 at high vacuum (or a higher vacuum) pressure while a high voltage is still applied to the electrodes to maintain the sample in its flattened state (FIG. 6, block, 670). In the embodiment depicted, processing sample 750 can include imaging multiple locations on the sample with a scanning electron microscope, but as noted, in other embodiments main chamber 710 can be a different type of processing chamber and the substrate processing operation can be something other than an imaging operation.

Figure 7H:
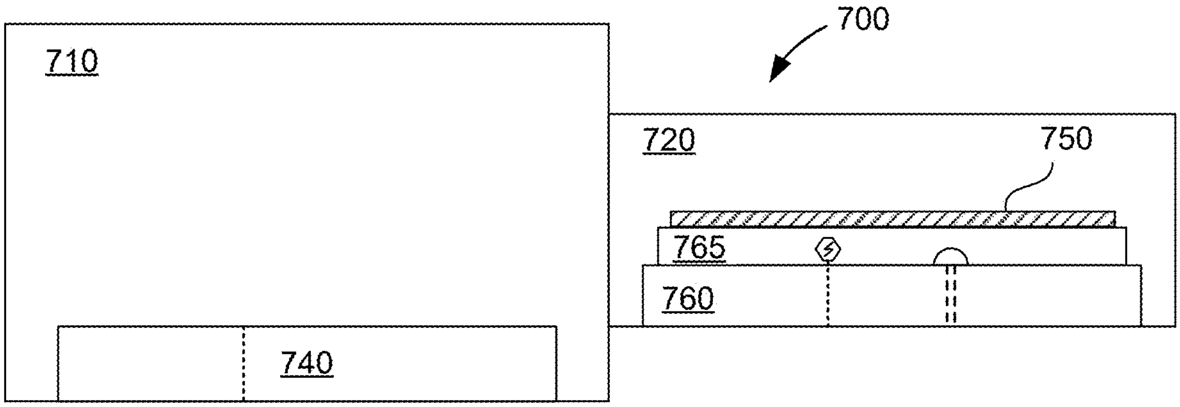
Figure 7I:
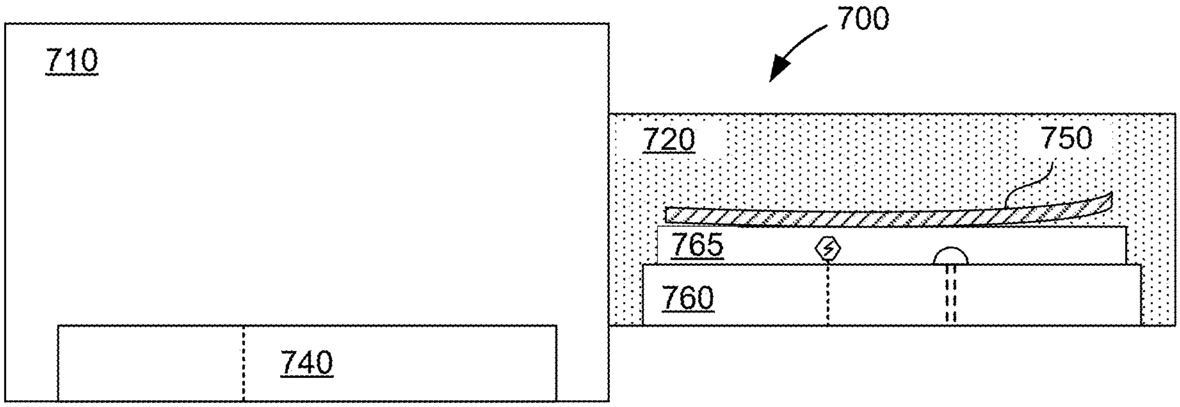

After processing is complete, the transfer unit picks up chuck carrier 765 (with sample 750 on its upper surface) and transfers the chuck carrier back into load lock chamber 720, as shown in FIG. 7H, while both the main processing chamber 710 and load lock chamber 720 are at vacuum (FIG. 6, step 680). Load lock chamber 720 can then be vented to atmosphere (FIG. 6, step 690) in preparation for transferring the sample out of the load lock chamber to a subsequent processing step. A voltage no longer needs to be applied to maintain the electrostatic clamping force during step 680 in which case sample 750 may return to its initial, warped state as shown in FIG. 7I.

Method 600 can then be repeated on a next sample.

In the embodiment depicted in FIGS. 7A-7I, transferring chuck carrier 765 from platform 760 to stage 740, temporarily disconnects the electrodes within the chuck carrier from a high voltage source. For example, when the transfer unit picks chuck carrier 765 up off platform 760 in step 650, the high voltage connection 772 is temporarily broken and not restored until the transfer unit places the chuck carrier onto stage 740 making high voltage connection 774 in step 660. The electrodes within chuck carrier 765 (e.g., series of electrodes 532, 534) can be designed to have enough mass, however, such that there is a sufficient charge built up on the electrodes that sample 750 remains chucked to the chuck carrier during the transfer process.

In other embodiments, the transfer unit can include a high voltage connection that mates with the high voltage lines in the chuck carrier to provide a continuous high voltage level to the electrodes in chuck carrier during the transfer process.

Hybrid Vacuum-Electrostatic Chuck in Main Chamber

In some embodiments, the main processing chamber can include a sample support that can secure and flatten the sample acting as both a vacuum chuck and an electrostatic chuck. Such a sample support is referred to herein as a hybrid vacuum-electrostatic chuck (or sometimes just "hybrid chuck" for short). The hybrid chuck can initially use its vacuum chucking feature to secure and flatten a sample while the main chamber is at atmospheric pressure. Next, the hybrid chuck can activate its electrostatic chuck capability to add electrostatic force to further secure the sample. The main chamber can then be pumped down to vacuum leaving electrostatic forces as the sole technique of flattening and clamping the sample to the hybrid chuck and the sample can be processed within the main chamber at a desired vacuum pressure.

Figure 8A:
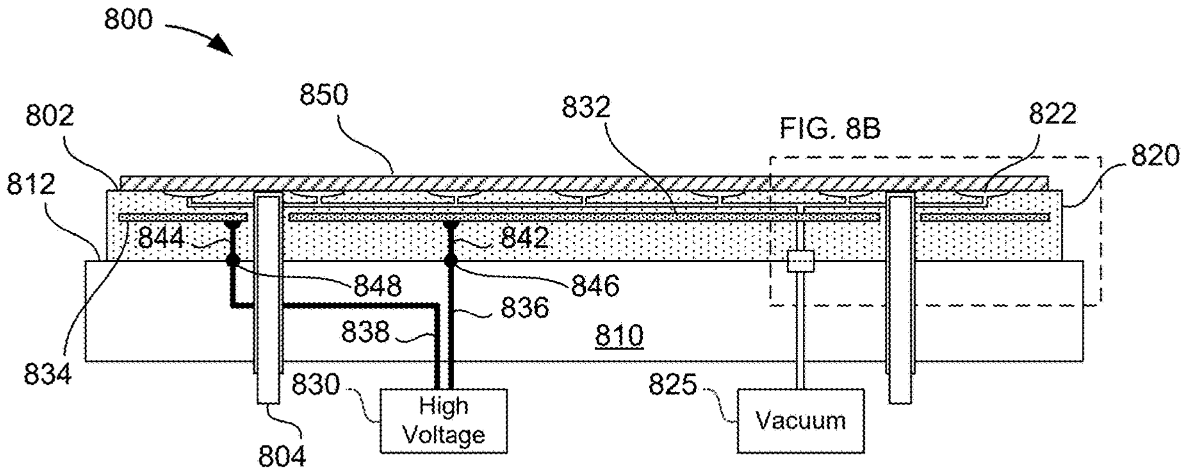
FIG. 8A is a simplified cross-sectional view of a hybrid vacuum-electrostatic chuck according to some embodiments.

FIG. 8A is a simplified cross-sectional view of a sample support system 800 that includes a hybrid vacuum-electrostatic chuck 820 (sometimes referred to herein as "hybrid chuck 820") according to some embodiments and a stage 810. Hybrid chuck 820 can be similar to hybrid chuck carrier 520 discussed above with respect to FIGS. 5A and 5B except that hybrid chuck 820 remains directly coupled to stage 810 in a processing chamber and is not transferred by a transfer unit between the processing chamber and a load lock chamber. Thus, hybrid chuck 820 includes a single set of lift pins 804 that can raise and lower a sample relative to an upper support surface 802 of the chuck rather than the two separate sets of lift pins 504, 506 discussed with respect to hybrid chuck carrier 520. As shown, hybrid chuck 820 has a sample 850 positioned on its upper surface 802 and the chuck is positioned on a stage 810 that can move the hybrid chuck along the X, Y and Z axes within a sample processing chamber.

Figure 8B:
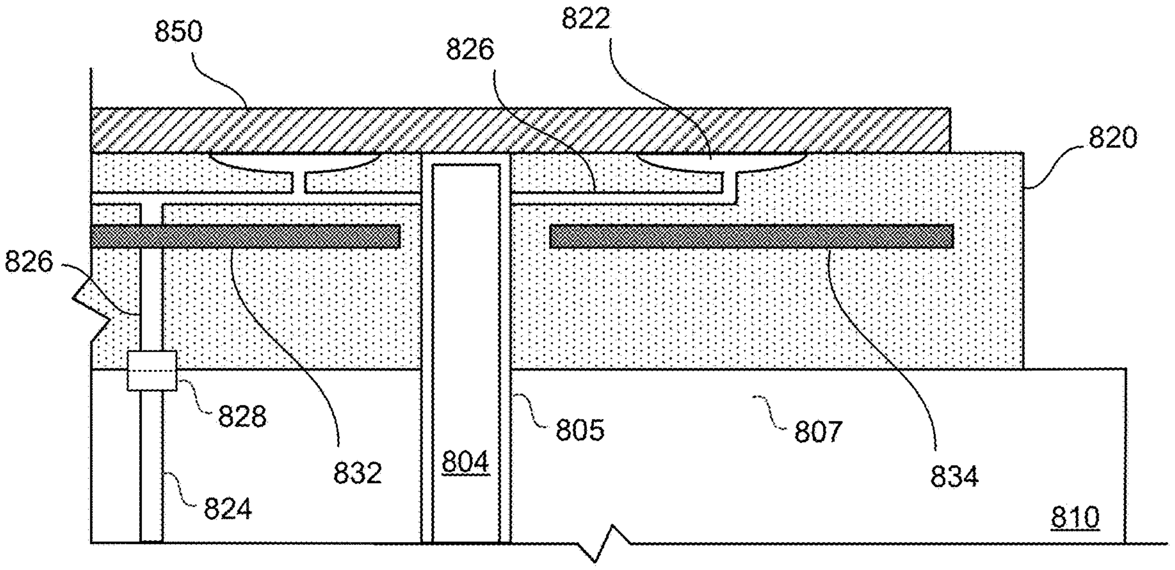
FIG. 8B is an expanded view of a portion of the hybrid vacuum-electrostatic chuck shown in FIG. 8A.

Also shown in FIG. 8A is a set of lift pins 804, a vacuum system 825 and a high voltage system 830. Lift pins 804 allow the sample to be raised above upper support surface 802 so that a transfer unit can slide under the sample and transfer the sample onto or off of hybrid chuck 820. Referring to both FIG. 8A and FIG. 8B, which is an expanded view of a portion of hybrid chuck 820, sample 850 and platform 810, each lift pin 804 is positioned within a respective lift pin hole 805 that extend entirely through platform and hybrid chuck 820.

Hybrid chuck 820 includes a plurality of vacuum channels 822 at its upper surface that can be operatively coupled to vacuum system 825 when the hybrid chuck is positioned on platform 810. For example, a first vacuum line 824 that extends from vacuum system 825 through platform 810 can be fluidly coupled to a second vacuum line 826 that runs through hybrid chuck 820 by a coupling 828. Each of the vacuum channels 822 is thus fluidly coupled to vacuum system 825 and operable to apply a vacuum to the back surface of sample 850 when vacuum system 825 is activated.

Hybrid chuck 820 also includes a series of electrodes 832, 834 that are operatively coupled to high voltage source 830 when the chuck is positioned on platform 810. Electrodes 832, 824 can be arranged in an alternating or other pattern just beneath upper surface 802 as described above with respect to electrodes 532, 534. As shown, high voltage lines 836, 838 extend from high voltage source 830 through platform 810. Lines 836, 838 can be electrically coupled to high voltage lines 842, 844, respectively, that run through hybrid chuck 820 by couplings 846, 848. Each series of electrodes 832, 834 is thus electrically coupled to high voltage system 830 and operable to generate electrostatic forces that clamp sample 850 to the hybrid chuck when the high voltage source 830 is activated.

Figure 9:
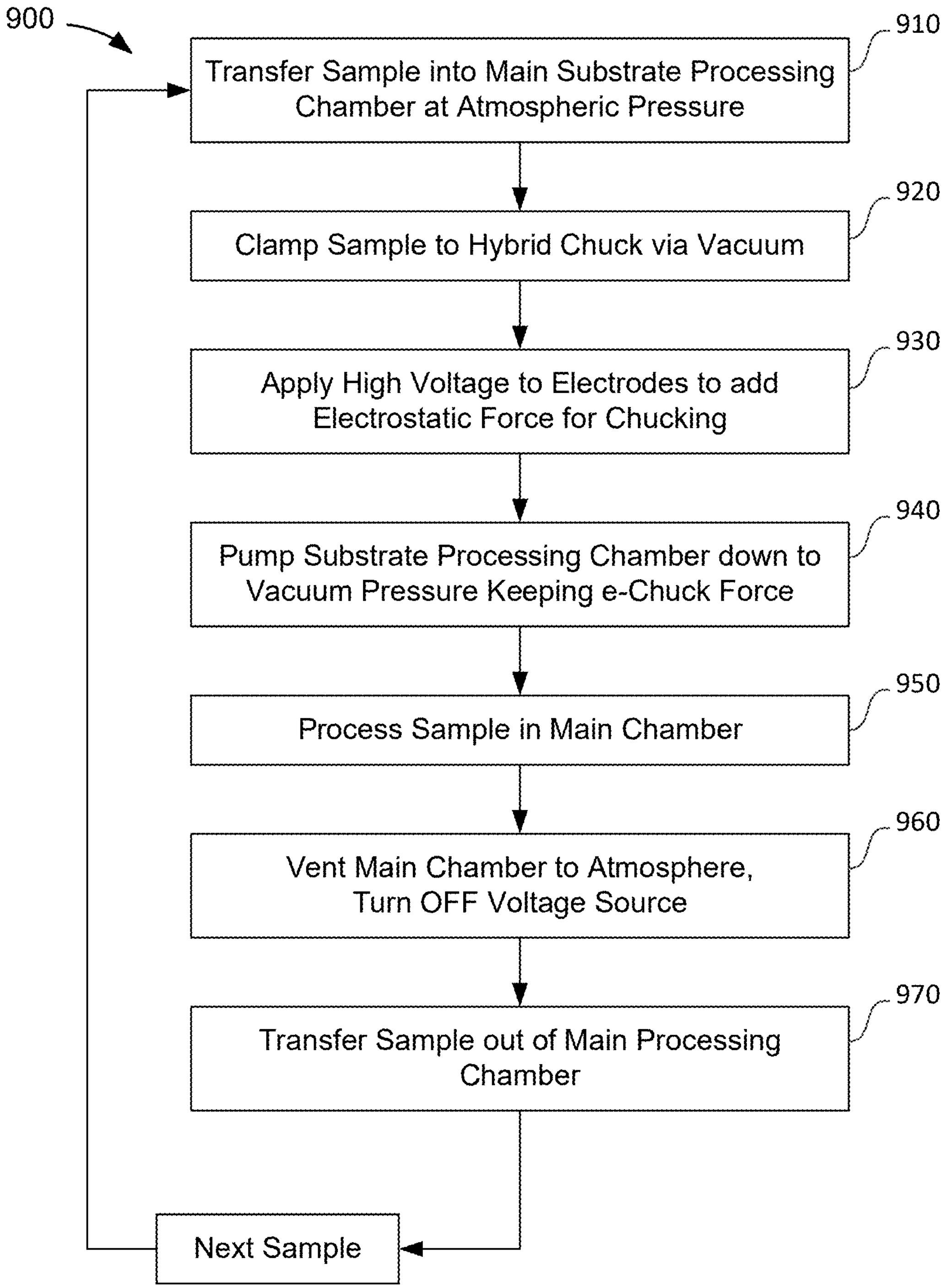
FIG. 9 is a flowchart depicting steps associated with a method of flattening and processing a warped substrate according to some embodiments.

In order to better understand and appreciate this embodiment, reference is made to FIGS. 9 and 10A to 10D where FIG. 9 is a flowchart depicting steps associated with a method 900 of flattening and processing a warped substrate according to some embodiments, and FIGS. 10A to 10D are simplified cross-sectional views of a substrate processing system 1000 according to some embodiments depicted at different stages of flattening and processing a warped substrate 1050 according to the method set forth in FIG. 9.

As shown, substrate processing system 1000 includes a main processing chamber 1010, which can perform the same substrate processing operations as that of chambers 110 and 210 discussed above and thus include many of the same components. In the place of sample support 140 or 240, however, substrate processing system 1000 includes a hybrid vacuum-electrostatic chuck 1020 that is operable to secure a sample 1050 within the processing chamber during a substrate processing operation. The hybrid chuck can be positioned within chamber 1010 on a stage 1040 that can move both the hybrid chuck and sample 1050 within processing chamber 1010 such that different portions of the sample are positioned directly under the field of view of an SEM column. Towards this end, stage 1040 can move the hybrid chuck and sample 1050 within chamber 1010 both left and right and forward and back (i.e., along both the X and Y axis) and can also raise and lower the hybrid chuck and sample along the Z axis.

Stage 1040 also includes a vacuum connection 1062 and a high voltage connection 1064 that can couple a vacuum system (not shown in FIG. 10A) and a high voltage source (also not shown), respectively, to corresponding connections on hybrid chuck 1020 when it is secured to stage 1040. For example, vacuum connection 1062 can be representative of vacuum line 824 and vacuum coupling 828 that couple vacuum system 825 to vacuum lines 826 within the hybrid chuck. Similarly, high voltage connection 1064 can be representative high voltage lines 836, 838 and high voltage couplings 846, 848 that couple high voltage source 830 to voltage lines 842, 844, respectively, within the hybrid chuck.

Figure 10A:
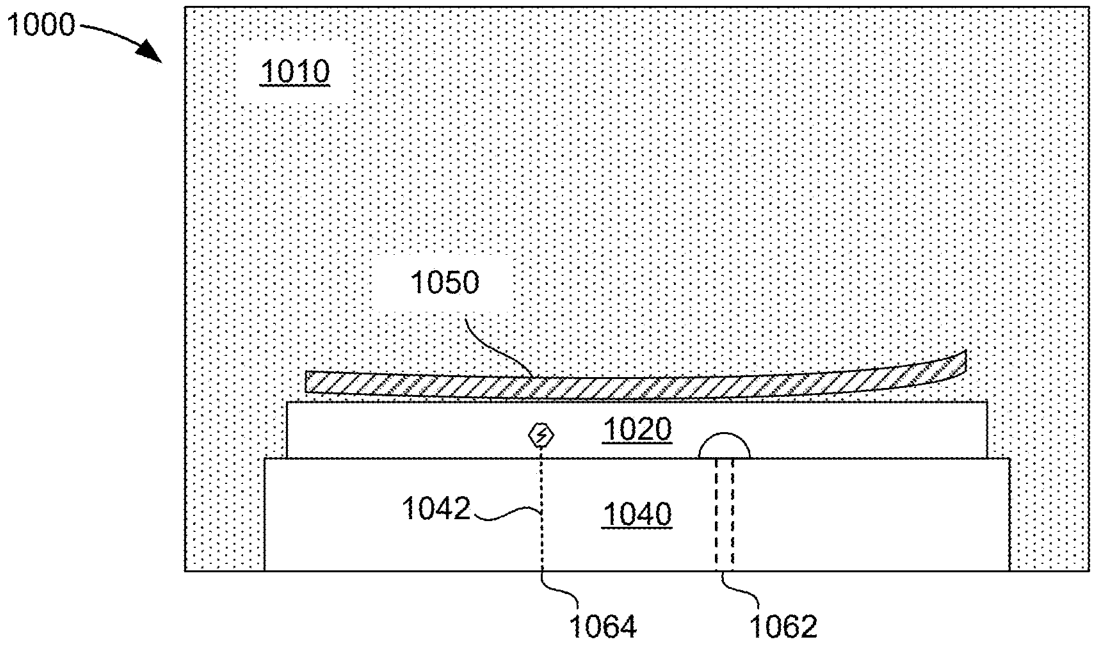
FIGS. 10A to 10D are simplified cross-sectional views of a substrate processing system according to some embodiments depicted at different stages of flattening and processing a warped substrate according to the method set forth in FIG. 9.

Referring to FIGS. 9 and 10A, method 900 starts by transferring a sample 1050 into substrate processing chamber 1010 and placing the sample on an upper support surface of hybrid chuck 1020 (FIG. 9, step 910). Hybrid chuck 1020 can be, for example, hybrid chuck 820 discussed above and thus can secure the sample to its upper surface using either or both vacuum and electrostatic chucking. Sample 1050 can be, for example, a thin semiconductor wafer. System 1000 can sequentially process hundreds or thousands of samples 1050 some of which can be highly warped as depicted in FIG. 10A.

While not shown in FIG. 10A, the transfer can be performed by an ETU that picks sample 1050 up from a load lock chamber and places the sample onto lift pins (e.g., lift pins 804) that protrude above the upper surface of hybrid chuck 1020 within processing chamber 1010. The lift pins can then be lowered (or stage 1040 can be raised) such that the sample is supported by an upper surface of chuck 1020 as shown in FIG. 10A. This initial transfer step can take place while processing chamber 1010 is at atmospheric pressure (as indicated by the dotted background of chamber 1010).

Figure 10B:
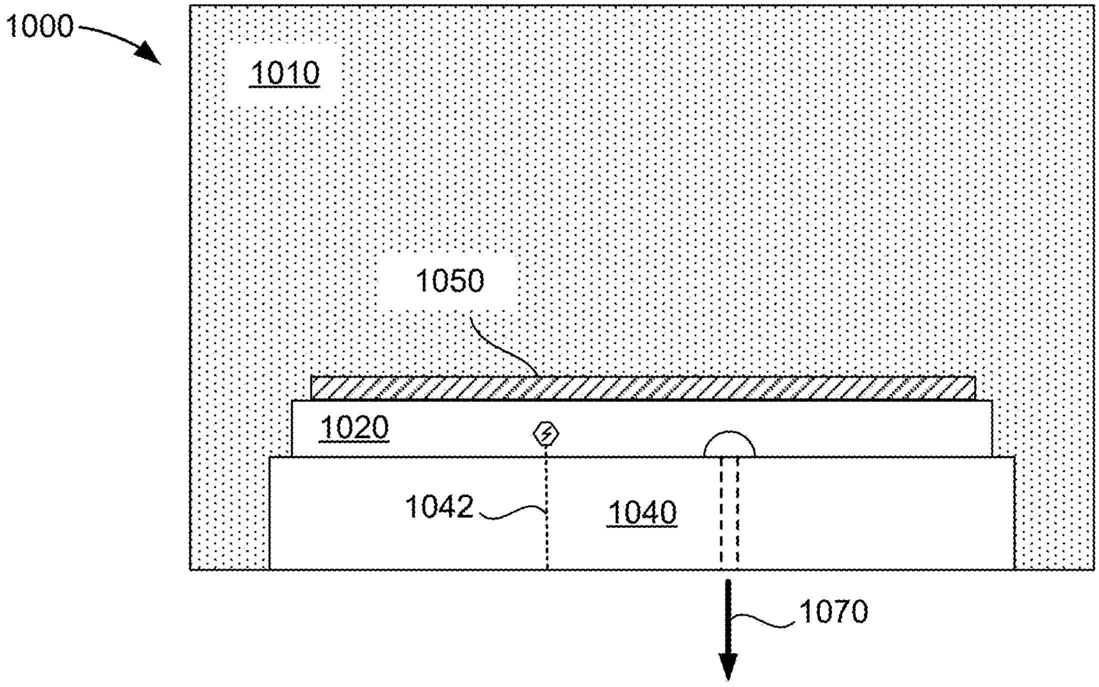

Next, the vacuum system can be activated as indicated in FIG. 10B by arrow 1070 to create a vacuum suction force on the bottom of sample 1050 (FIG. 9, step 920). Applying a vacuum to the backside of sample 1050 clamps the sample to the upper surface of hybrid chuck 1020 and flattens the sample as shown in FIG. 10B. While a vacuum is applied to the backside of sample 1050 (and while the load lock chamber is still at atmospheric pressure), the high voltage source can be activated as indicated by arrow 1072 in FIG. 10C to add an electrostatic force for further securing sample 1050 to the chuck carrier 1020 (FIG. 9, step 930).

Figure 10C:
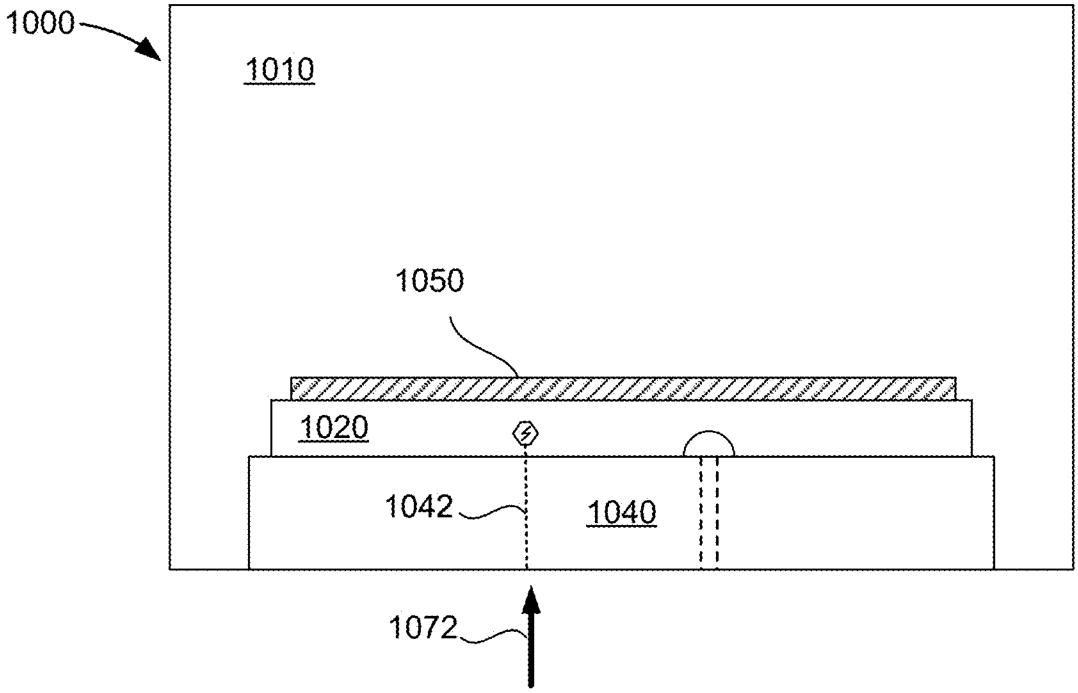

Processing chamber 1010 can then be pumped down to vacuum (as indicated by the absence of the dotted background in FIG. 10C) to the desired substrate processing pressure (e.g., a pressure between a high and ultra high vacuum levels) and the vacuum system clamping sample 1050 to chuck carrier 1020 can be turned off as indicated by the absence of arrow 1070 in FIG. 10C. The high voltage applied to the electrodes is maintained during this time (arrow 1072) so that electrostatic force is the only force clamping sample 1050 to the hybrid chuck (FIG. 9, step 940).

At this stage, sample 1050 can be processed within processing chamber 1010 while a high voltage is still applied to the electrodes to maintain the sample in its flattened state (FIG. 9, block, 950). Initially chucking sample 1050 with a vacuum chuck and then switching the clamping force to an electrostatic force in method 900 is able to keep some highly warped samples flattened that could not otherwise be flatted by the electrostatic force alone.

Figure 10D:
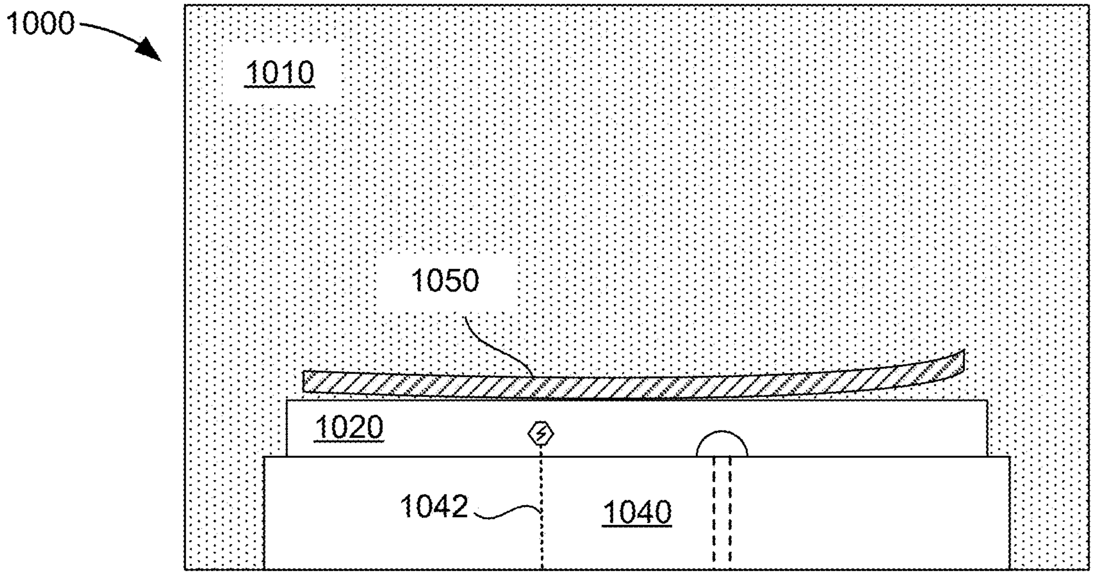

After processing is complete, high voltage source 1072 is turned OFF and the processing chamber is vented to atmosphere (FIG. 9, step 960) as shown in FIG. 10D. The sample can then be lifted by lift pins above the upper surface of hybrid chuck 1020 and an ITU (not shown) can pick up the sample 1050 and transfer the sample back into a load lock chamber (not shown) while both the main processing chamber 1010 and load lock chamber 1020 are at atmosphere (FIG. 9, step 970).

Method 900 can then be repeated on a next sample.

Processing Chamber With Main Chamber and Separate Auxiliary Volume

In still other embodiments, the main processing chamber can include a separate auxiliary volume or chamber that can be sealed off from the main chamber. The system can include a substrate support that can secure and flatten the sample acting as both a vacuum chuck and an electrostatic chuck similar as described above with respect to the hybrid vacuum-electrostatic chuck. But, when processing a series of samples, instead of repeatedly venting the main chamber and then pumping the main chamber down to a desired vacuum pressure for the processing operations, the substrate support (stage) can move the hybrid chuck and sample between the main processing chamber and the auxiliary volume. The auxiliary volume, which can have a much lower volume than the main processing chamber, can then be sealed off from the main processing chamber and vented to atmosphere.

Figure 11:
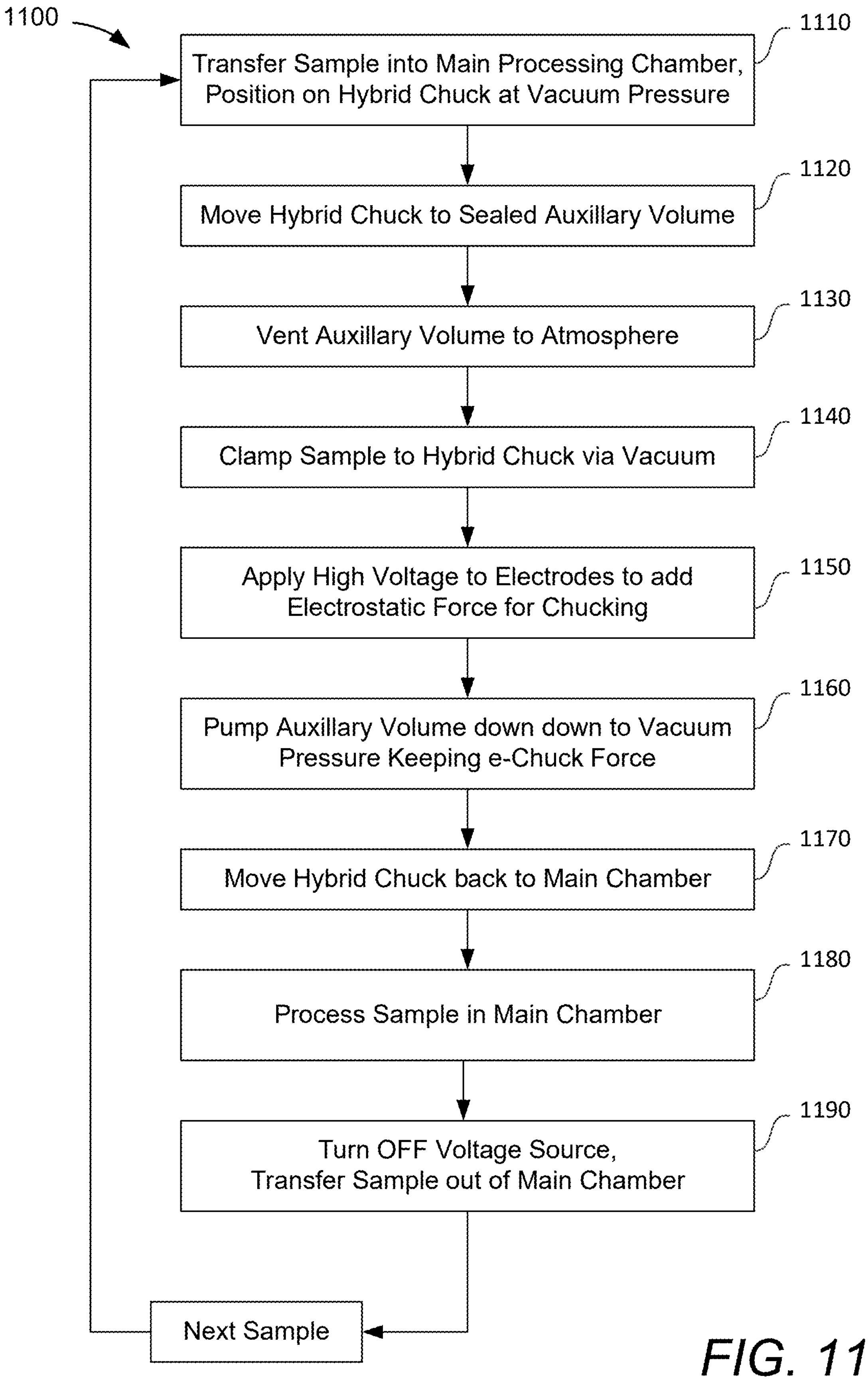
FIG. 11 is a flowchart depicting steps associated with a method of flattening and processing a warped substrate according to some embodiments.

Once so positioned within the auxiliary volume, the hybrid chuck can use its vacuum chucking feature to secure and flatten a sample while the auxiliary chamber is at atmospheric pressure. Next, the hybrid chuck can activate its electrostatic chuck capability to add electrostatic force to secure the sample. The auxiliary volume can then be pumped down to vacuum leaving electrostatic forces as the sole force flattening and clamping the sample to the hybrid chuck. Since the auxiliary volume has a much smaller volume than main processing chamber, it can be pumped down to a desired vacuum pressure considerable faster improving the throughput of processing multiple wafers. The hybrid chuck can then be moved back into a processing position within the main chamber and processed at a desired vacuum pressure. To illustrate, reference is made to FIGS. 11 and 12A to 12G where FIG. 11 is a flowchart depicting steps associated with a method 1100 of flattening and processing a warped substrate according to some embodiments, and FIGS. 12A to 12G are simplified cross-sectional views of a substrate processing system 1200 according to some embodiments depicted at different stages of flattening and processing a warped substrate 1250 according to the method set forth in FIG. 11.

As shown, substrate processing system 1200 includes a main processing chamber 1210, which can include many of the same components as, and perform the same general substrate processing operation as, chamber 110 or 210 discussed above. Substrate processing system 1200 also includes a hybrid vacuum-electrostatic chuck 1220 and a separate auxiliary chamber or volume that can be environmentally sealed from the main processing chamber 1210.

Hybrid vacuum-electrostatic chuck 1220 can secure a sample 1250 within the processing chamber during a substrate processing operation and can be positioned within chamber 1210 on a stage 1240 that can move both the hybrid chuck and sample 1250 within processing chamber. Hybrid chuck 1220 and stage 1240 can be similar to hybrid chuck 1020 and stage 1040 described above. In this embodiment, however, stage 1040 can move the hybrid chuck to different locations within processing chamber 1210 such that different portions of the sample are positioned directly under the field of view of an SEM column and can also move the hybrid chuck into and out of auxiliary volume 1030.

As depicted, stage 1240 includes a vacuum connection 1262 and a high voltage connection 1264 that can couple a vacuum system (not shown in FIG. 12A) and a high voltage source (also not shown), respectively, to corresponding connections on hybrid chuck 1220 when it is secured to stage 1240. For example, vacuum connection 1262 can be representative of vacuum line 824 and vacuum coupling 828 that couple vacuum system 825 to vacuum lines 826 within the hybrid chuck. Similarly, high voltage connection 1264 can be representative high voltage lines 836, 838 and high voltage couplings 846, 848 that couple high voltage source 830 to voltage lines 842, 844, respectively, within the hybrid chuck.

Figure 12A:
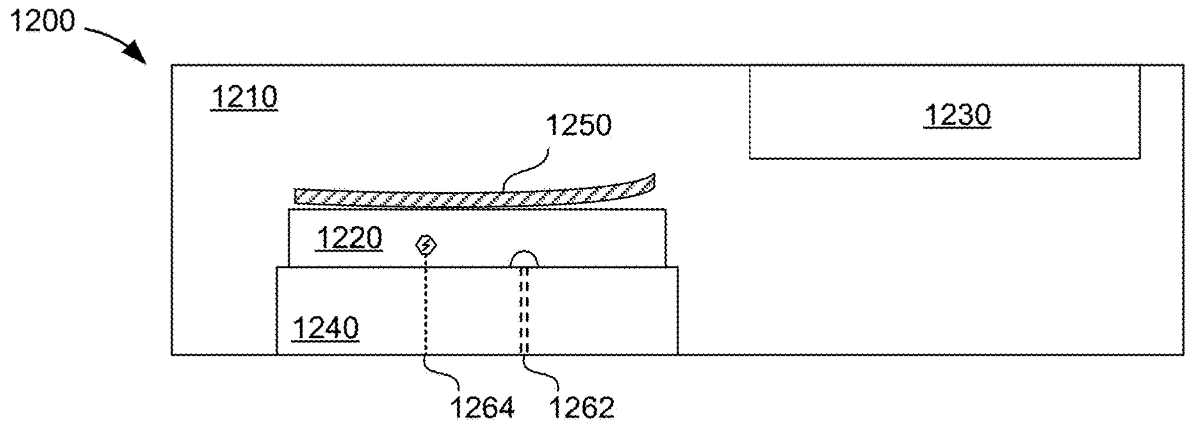
FIGS. 12A to 12G are simplified cross-sectional views of a substrate processing system according to some embodiments depicted at different stages of flattening and processing a warped substrate according to the method set forth in FIG. 11.

Referring to FIGS. 11 and 12A, method 1100 starts by transferring a sample 1250 into substrate processing chamber 1210 and placing the sample on an upper support surface of hybrid chuck 1220 (FIG. 11, step 1110). Hybrid chuck 1220 can be, for example, hybrid chuck 820 discussed above and thus be capable of securing the sample to its upper surface using either or both vacuum and electrostatic chucking. Sample 1250 can be, for example, a thin semiconductor wafer that can have a varying degree of warpage.

While not shown in FIG. 12A, the transfer can be performed by an ETU that picks sample 1250 up from a load lock chamber and places the sample onto lift pins (e.g., lift pins 804) that protrude above the upper surface of hybrid chuck 1220 within processing chamber 1210. The lift pins can then be lowered (or stage 1240 can be raised) such that the sample is supported by an upper surface of chuck 1220 as shown in FIG. 12A. This initial transfer step can take place while both the load lock chamber and substrate processing chamber 1210 are at vacuum pressure.

Figure 12B:
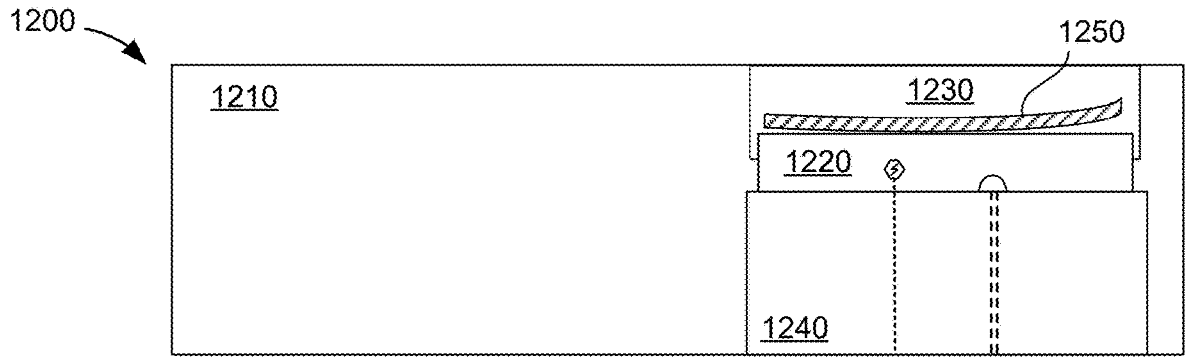

Next, stage 1240 moves the sample from the main chamber 1210 to auxiliary volume 1230 as shown in FIG. 12B (FIG. 11, step 1120). Moving the stage during step 1120 can include moving the stage along one or both of the X- and Y-axes until the stage is appropriately positioned beneath auxiliary volume 1230 and then raising the stage so that sample 1250 and at least a portion of hybrid chuck 1220 is within auxiliary volume 1230 such that the auxiliary volume is environmentally sealed from main processing chamber 1210. Sealing the auxiliary volume from the main processing chamber can be done using any appropriate technique or mechanism as would be known to those of skill in the art.

Figure 12C:
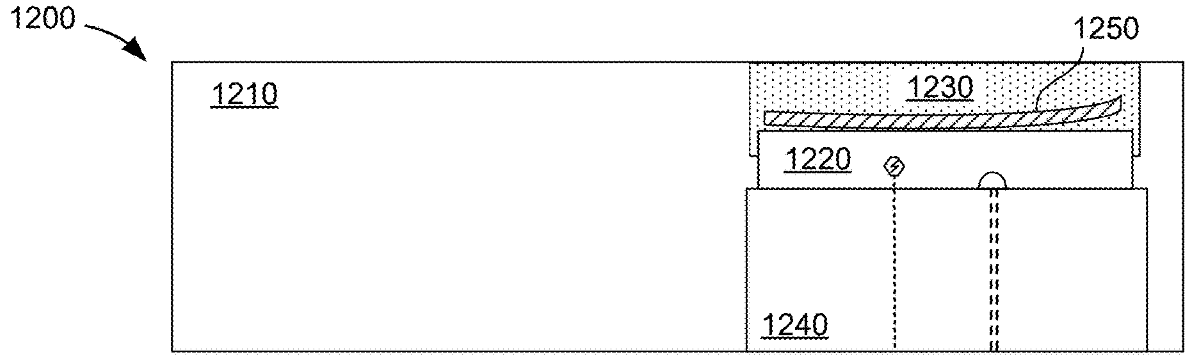
Figure 12D:
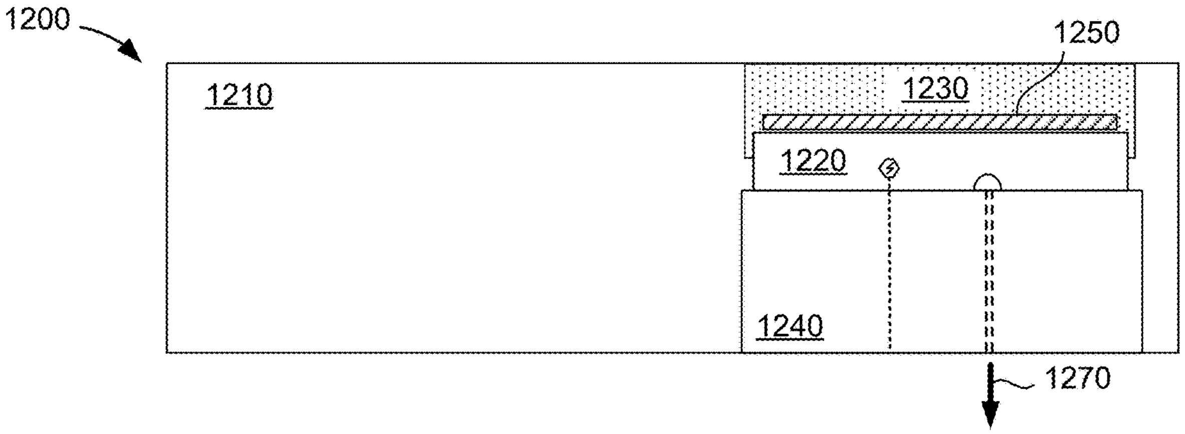

The auxiliary volume 1230 can then be vented to atmosphere (FIG. 11, step 1130) while the main processing chamber remains at vacuum as shown in FIG. 12C. The vacuum chuck portion of hybrid chuck 1220 can then be activated as indicated in FIG. 12D by arrow 1270 to create a vacuum suction force on the bottom of sample 1250 (FIG. 11, step 1140). Applying a vacuum to the backside of sample 1250 clamps the sample to the upper surface of hybrid chuck 1220 and flattens the sample as shown in FIG. 12D.

Figure 12E:
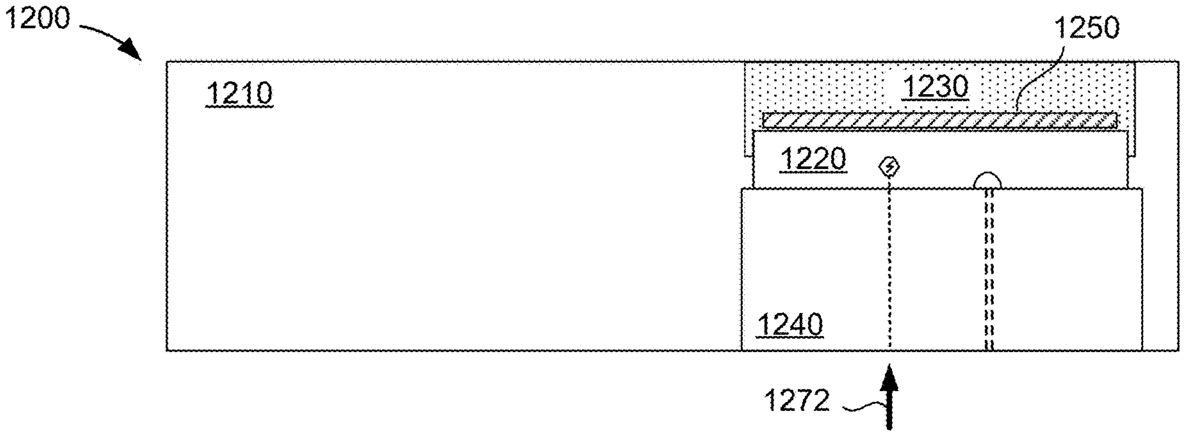

While a vacuum is applied to the backside of sample 1250 (and while auxiliary volume 1030 is still at atmospheric pressure), the high voltage source can be activated as indicated by arrow 1272 in FIG. 12E to add an electrostatic force for further securing sample 1250 to hybrid chuck 1220 (FIG. 11, step 1150).

Figure 12F:
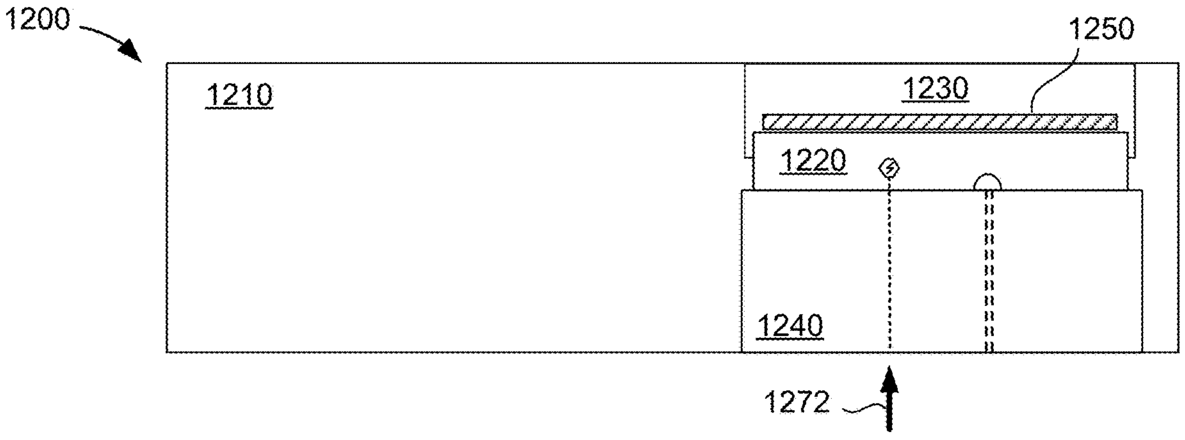

The auxiliary volume 1230 can then be pumped down to vacuum (as indicated by the absence of the dotted background in FIG. 12F) to the same vacuum pressure as substrate processing system 1210 and the vacuum system clamping sample 1250 to the hybrid chuck 1220 can be turned off as indicated by the absence of arrow 1270 in FIG. 12F. The high voltage applied to the electrodes is maintained during this time (arrow 1272) so that electrostatic force is the only force clamping sample 1250 to hybrid chuck 1220 (FIG. 11, step 1160).

Figure 12G:
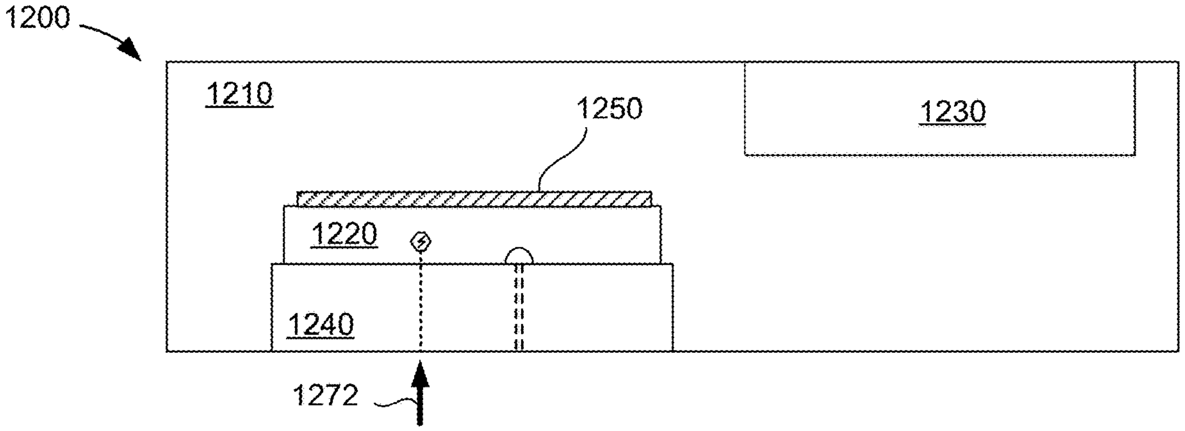

Next, stage 1240 can be moved back to the main processing area of chamber 1210 (FIG. 11, step 1170) as shown in FIG. 12G and sample 1250 can be processed within processing chamber 1210 while a high voltage is still applied to the electrodes to maintain the sample in its flattened state (FIG. 11, step 1180). As described above with respect to earlier embodiments, initially chucking sample 1250 with a vacuum chuck and then switching the clamping force to an electrostatic force in method 1100 is able to keep some highly warped samples flattened that could not otherwise be flatted by the electrostatic force alone.

After processing is complete, the high voltage source 1172 can be turned OFF, the sample can be lifted by lift pins above the upper surface of hybrid chuck 1220 and an ITU (not shown) can pick up the sample and transfer the sample back into a load lock chamber (not shown) while both the main processing chamber 1210 and load lock chamber 1220 are at vacuum (FIG. 11, step 1190).

Method 1100 can then be repeated on a next sample.

Additional Embodiments

The foregoing description, for purposes of explanation, used specific nomenclature to provide a thorough understanding of the described embodiments. However, it will be apparent to one skilled in the art that the specific details are not required in order to practice the described embodiments. For example, while examples discussed above sometimes referred to the sample processing chamber as a scanning electron microscope tool, embodiments disclosed herein can be used with many other types of sample processing chambers in which the substrate or other type of sample needs to be secured and/or flattened prior to being processed under vacuum conditions as would be appreciated by a person of skill in the art. As another example, while the illustrative examples set forth above all activated the vacuum chuck feature to secure and flatten a sample while the sample was in a chamber or other sealed and enclosed area at atmospheric pressure (i.e., 760 torr), embodiments are not limited to such and in other embodiments samples can be initially secured and flattened by the vacuum chuck at pressure lower than 760 torr. Indeed, a person of skill in the art will realize that it is the difference in pressure between the pressure generated by the vacuum chuck at the lower surface of the sample and the pressure of the chamber/environment that the sample is positioned in that matters. A vacuum chuck cannot fully secure and flatten a sample when the sample is in a high vacuum environment. Such a chuck can secure and flatten some samples, however, at pressure levels below 760 torr, such those within what can be considered "rough vacuum ranges" (e.g., pressures less than 760 torr but greater than 25 torr). The skilled artisan will further realize that larger pressure differences between the vacuum pressure generated by the vacuum chuck at the sample's lower surface and the chamber/environment pressure at the sample's upper surface, can secure and flatten samples that have a higher degree of warpage than can be secured and flattened if a lower pressure difference is generated between those opposing surfaces of the sample.

Additionally, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

What is claimed is:

1. A method of processing a substrate, the method comprising:

positioning the substrate on an upper surface of a substrate holder in a first chamber, wherein the substrate holder is removably positioned on a platform and comprises one or more vacuum channels disposed at the upper surface and one or more electrodes disposed within the substrate holder proximate to the upper surface;

while the substrate holder is within the first chamber, clamping and flattening the substrate to the substrate holder by applying a vacuum from a vacuum system through the platform to the one or more vacuum channels;

while the substrate is clamped to the substrate holder via the one or more vacuum channels, applying a voltage from a first voltage source through the platform to the one or more electrodes to further clamp the substrate to the substrate holder with an electrostatic force;

pumping out the first chamber to a vacuum pressure while continuing to clamp the substrate to the substrate holder with the electrostatic force;

while the substrate is clamped to the substrate holder by the electrostatic force, transferring the substrate holder from the first chamber into a second chamber under vacuum conditions by physically disconnecting the substrate holder from the platform and the first voltage source such that the substrate remains clamped to the substrate holder by a residual charge on the one or more electrodes during the transferring;

positioning the substrate holder on a stage in the second chamber; and while the substrate holder is positioned on the stage within the second chamber, electrically coupling the substrate holder to a second voltage source to maintain the electrostatic force clamping the substrate to the substrate holder, and processing the substrate in the second chamber at a vacuum pressure.

2. The method of processing the substrate according to claim 1 wherein the first chamber is a load lock chamber and the second chamber is a substrate processing chamber.

3. The method of processing the substrate according to claim 2 wherein clamping and flattening the substrate to the substrate holder by applying a vacuum to the one or more vacuum channels occurs while the load lock chamber is at atmospheric pressure.

4. The method of processing the substrate according to claim 3 further comprising, after processing the substrate in the second chamber under vacuum conditions, transferring the substrate holder with the substrate positioned thereon, back to the load lock chamber.

5. The method of processing the substrate according to claim 4 further comprising, after transferring the substrate holder with the substrate positioned thereon back to the load lock chamber, venting the load lock chamber to atmosphere and transferring the substrate out of the load lock chamber.

6. The method of processing the substrate according to claim 2 wherein the substrate processing chamber comprises a scanning electron microscope, and processing the substrate comprises imaging the substrate with the scanning electron microscope.

7. The method of processing the substrate according to claim 1 wherein the substrate has a warpage of at least 1.0 millimeters between a lowest point and a highest point on the substrate.

8. The method of processing the substrate according to claim 1 wherein the vacuum pressure that the sample is processed at in the second chamber is a high vacuum pressure or lower.

9. The method of processing the substrate according to claim 1 wherein the one or more electrodes comprise at least two electrodes arranged in an interleaved pattern with each other.

10. The method of processing the substrate according to claim 1 wherein the substrate is a semiconductor wafer.

11. A system for processing a substrate, the system comprising:

a main substrate processing chamber;

a load lock chamber;

a substrate holder configured to transfer the substrate between the load lock chamber and the main substrate processing chamber;

at least one processor and at least one memory coupled to the at least one processor, the at least one memory including a plurality of computer-readable instructions that, when executed by the at least one processor, cause the system to:

transfer the substrate into the load lock chamber and position the substrate on an upper surface of the substrate holder in the load lock chamber, wherein the substrate holder is removably positioned on a platform and comprises one or more vacuum channels disposed at the upper surface and one or more electrodes disposed within the substrate holder proximate to the upper surface;

while the substrate holder is within the load lock chamber, clamp and flatten the substrate to the substrate holder by applying a vacuum from a vacuum system through the platform to the one or more vacuum channels;

while the substrate is clamped to the substrate holder via the one or more vacuum channels, apply a voltage from a first voltage source through the platform to the one or more electrodes to further clamp the substrate to the substrate holder with an electrostatic force;

pump out the load lock chamber to a vacuum pressure while continuing to clamp the substrate to the substrate holder with the electrostatic force;

while the substrate is clamped to the substrate holder by the electrostatic force, transfer the substrate and substrate holder, under vacuum conditions, from the load lock chamber into the main substrate processing chamber with the substrate holder by physically disconnecting the substrate holder from the platform and the first voltage source such that the substrate remains clamped to the substrate holder by a residual charge on the one or more electrodes during the transferring;

positioning the substrate holder on a stage in the second chamber; and while the substrate is positioned on the stage within the second chamber, electrically coupling the substrate holder to a second voltage source to maintain the electrostatic force clamping the substrate to the substrate holder, and process the substrate in the main substrate processing chamber at a vacuum pressure.

12. The system for processing the substrate according to claim 11 wherein clamping and flattening the substrate to the substrate holder by applying a vacuum to the one or more vacuum channels occurs while the load lock chamber is at atmospheric pressure.

13. The system for processing the substrate according to claim 11 wherein the main substrate processing chamber comprises a scanning electron microscope and processing the substrate in the main processing chamber comprises imaging the substrate with the scanning electron microscope.

14. The system for processing the substrate according to claim 11 wherein the substrate has a warpage of at least 1.0 millimeters between a lowest point and a highest point on the substrate.

15. The system for processing the substrate according to claim 11 wherein the vacuum pressure that the sample is processed at in the main substrate processing chamber is a high vacuum pressure or lower.

16. The system for processing the substrate according to claim 11 wherein the one or more electrodes comprise at least two electrodes arranged in an interleaved pattern with each other.

17. A non-transitory computer-readable memory that stores instructions for processing a substrate by:

positioning the substrate on an upper surface of a substrate holder in a first chamber, wherein the substrate holder is removably positioned on a platform and comprises one or more vacuum channels disposed at the upper surface and one or more electrodes disposed within the substrate holder proximate to the upper surface;

while the substrate holder is within the first chamber, clamping and flattening the substrate to the substrate holder by applying a vacuum from a vacuum system through the platform to the one or more vacuum channels;

while the substrate is clamped to the substrate holder via the one or more vacuum channels, applying a voltage from a first voltage source through the platform to the one or more electrodes to further clamp the substrate to the substrate holder with an electrostatic force;

pumping out the first chamber to a vacuum pressure while continuing to clamp the substrate to the substrate holder with the electrostatic force;

while the substrate is clamped to the substrate holder by the electrostatic force, transferring the substrate holder from the first chamber into a second chamber under vacuum conditions by physically disconnecting the substrate holder from the platform and the first voltage source such that the substrate remains clamped to the substrate holder by a residual charge on the one or more electrodes during the transferring;

positioning the substrate holder on a stage in the second chamber;

while the substrate holder is positioned on the stage within the second chamber, electrically coupling the substrate holder to a second voltage source to maintain maintaining the electrostatic force clamping the substrate to the substrate holder, and processing the substrate in the second chamber at a vacuum pressure.

18. The non-transitory computer-readable memory according to claim 17 wherein clamping and flattening the substrate to the substrate holder by applying a vacuum to the one or more vacuum channels occurs while the first chamber is at atmospheric pressure.

19. The non-transitory computer-readable memory according to claim 17 wherein processing the substrate in the processing chamber comprises imaging the substrate with a scanning electron microscope.

20. The non-transitory computer-readable memory according to claim 17 wherein the vacuum pressure that the sample is processed at in the second chamber is a high vacuum pressure or lower.

* * * * *